(12) United States Patent
Egawa

(10) Patent No.: US 11,095,092 B2
(45) Date of Patent: Aug. 17, 2021

(54) SWITCH CIRCUIT AND LASER IRRADIATION DEVICE

(71) Applicant: ASAHI KASEI MICRODEVICES CORPORATION, Tokyo (JP)

(72) Inventor: Kazuki Egawa, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/930,488

(22) Filed: Jul. 16, 2020

(65) Prior Publication Data

US 2021/0044085 A1 Feb. 11, 2021

(30) Foreign Application Priority Data

Aug. 9, 2019 (JP) .............................. JP2019-146963
May 29, 2020 (JP) .............................. JP2020-094758

(51) Int. Cl.
*H01S 5/042* (2006.01)
*H03K 17/16* (2006.01)

(52) U.S. Cl.
CPC ........... *H01S 5/042* (2013.01); *H03K 17/161* (2013.01)

(58) Field of Classification Search
CPC ........... H01S 5/00; H01S 5/042; H03K 17/00; H03K 17/04123; H03K 17/063; H03K 17/0822; H03K 17/161; H03K 17/687; H03K 2217/00; H03K 2217/0036
USPC ........................................................ 327/427
See application file for complete search history.

(56) References Cited

U.S. PATENT DOCUMENTS

| | | | |
|---|---|---|---|
| 2002/0190779 A1* | 12/2002 | Aiba | ......................... H03L 7/02 327/530 |
| 2005/0280457 A1 | 12/2005 | Alba et al. | |
| 2008/0258702 A1* | 10/2008 | Kanamaru | ....... H03K 19/00384 323/351 |
| 2012/0013389 A1* | 1/2012 | Thomas | .................. G05F 3/262 327/374 |
| 2012/0126859 A1 | 5/2012 | Kawamoto et al. | |
| 2014/0084964 A1 | 3/2014 | Kawamoto et al. | |

FOREIGN PATENT DOCUMENTS

| | | |
|---|---|---|
| JP | 2002-190726 A | 7/2002 |
| JP | 2012-129971 A | 7/2012 |

\* cited by examiner

*Primary Examiner* — Lincoln D Donovan
*Assistant Examiner* — Dave Mattison
(74) *Attorney, Agent, or Firm* — Morgan, Lewis & Bockius LLP

(57) ABSTRACT

The switch circuit includes a MOS transistor one end of which is coupled to a power supply line and to a control terminal of which voltage is input, a switch coupled between the power supply line and one end of the MOS transistor or one end of which is coupled to the other end of the MOS transistor, a MOS transistor coupled between an output terminal and ground potential, and a series-connected switch and constant current source coupled to a connection point between an opposite-side end of the whole series-connected MOS transistor and switch to the power supply line and the control terminal of the MOS transistor and performing adjustment to prevent current from flowing from the MOS transistor to ground potential after the switch turns on until the MOS transistor turns on.

12 Claims, 20 Drawing Sheets

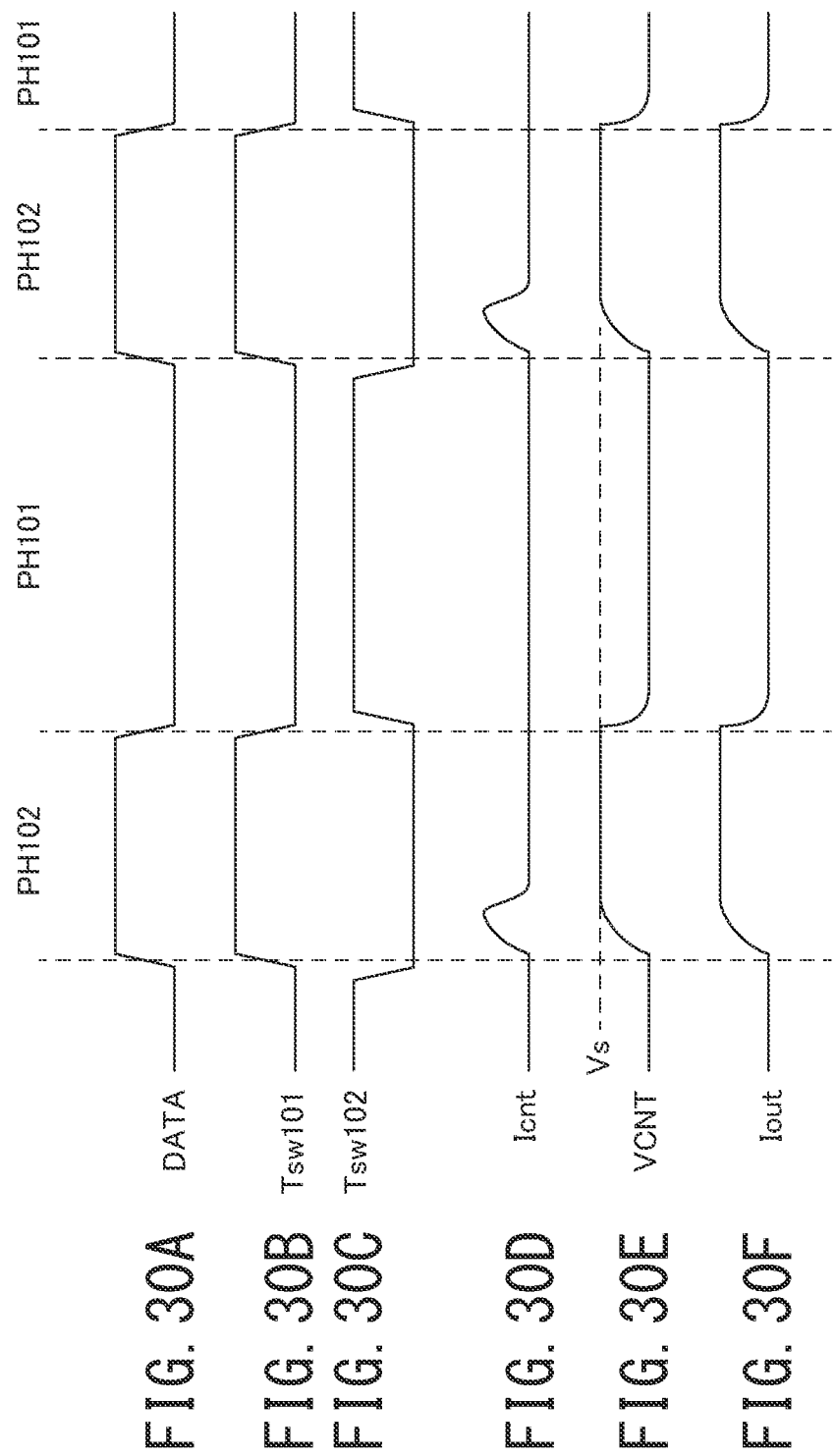

SWITCH CIRCUIT AND LASER IRRADIATION DEVICE

CROSS REFERENCE TO RELATED APPLICATIONS AND INCORPORATION BY REFERENCE

This application claims benefit of priority under 35 USC 119 based on Japanese Patent Applications Nos. 2019-146963 and 2020-094758 filed on Aug. 9, 2019 and May 29, 2020, the entire contents of which are incorporated by reference herein.

TECHNICAL FIELD

The present invention relates to a switch circuit and a laser irradiation device.

BACKGROUND ART

Conventionally, in applications such as digital versatile discs (DVDs), a laser beam printer and a range-finding camera, light emitting diodes (LEDs) or laser diodes are driven. In order to drive such LEDs and laser diodes, it is required to perform switching control (on/off control) of large current in a range from several hundreds of mA to several A at high frequency in a range from several tens to several hundreds of MHz. Therefore, various proposals have hitherto been made with respect to high-speed large-current switch circuits (see, for example, JP 2002-190726 A).

As a conventional high-speed large-current switch circuit, for example, a circuit illustrated in FIG. 27 has been known. FIG. 27 illustrates an example of a laser irradiation device 100 including a high-speed large-current switch circuit SC101.

As illustrated in FIG. 27, the laser irradiation device 100 includes a control circuit C101, a current drive circuit DR101, and a laser diode LD101.

The control circuit C101 outputs a light emission signal DATA that indicates timings of driving current. The light emission signal DATA is a signal that is at the H level when current is output and at the L level when current is not output.

The current drive circuit DR101 includes the switch circuit SC101, a timing generation circuit TM101 that generates timing signals required for timing control of the switch circuit SC101, and a bias voltage generation circuit REF101 that generates bias voltage VB1 determining the amount of current generated by the switch circuit SC101.

The light emission signal DATA is input to the timing generation circuit TM101 in the current drive circuit DR101. The timing generation circuit TM101 generates timing signals Tsw101 and Tsw102 that are required in the switch circuit SC101 in accordance with the light emission signal DATA.

To an output terminal O1 of the current drive circuit DR101, the cathode side of the laser diode LD101 is connected, and the anode side of the laser diode LD101 is connected to a power supply line VDD.

In FIG. 28, an example of a configuration of the switch circuit SC101 is illustrated. The switch circuit SC101 includes an N-type MOS transistor Q102 that switches flowing current at high speed by performing switching operation and outputs the current and a current control circuit SF101 that performs switching control of the MOS transistor Q102. The MOS transistor Q102 has the source grounded, and the drain connected to the output terminal O1 of the switch circuit SC101. A gate voltage VCNT thereof is driven by the current control circuit SF101.

The current control circuit SF101 includes an N-type MOS transistor Q101 and a constant current source I101 that is connected to the source of the MOS transistor Q101 and serves as a load and forms a source follower. Between the drain of the MOS transistor Q101 and the power supply line VDD, a switch SW101 is connected that is configured to perform switching control of current flowing between the drain and source of the MOS transistor Q101 and is constituted by a MOS transistor or the like. The output node of the source follower is connected to a gate Vcnt of the MOS transistor Q102, and, between the output node and the gate Vcnt of the MOS transistor Q102, one end of a switch SW102 that is constituted by a MOS transistor or the like that can be freely grounded is connected, and the other end of the switch SW102 is grounded.

To the switches SW101 to SW102, the timing signals Tsw101 and Tsw102 from the timing generation circuit TM101 are supplied, respectively. The bias voltage VB1 is applied to the gate of the MOS transistor Q101, and a value of output current Iout output from the current drive circuit DR101 is determined according to the bias voltage VB1.

FIG. 29 is a configuration diagram illustrative of an example of the timing generation circuit TM101. As illustrated in FIG. 29, the timing generation circuit TM101 includes inverter circuits INV101 and INV102 that are connected in series. The light emission signal DATA is input to the inverter circuit INV101, and the output of the inverter circuit INV102 and the output of the inverter circuit INV101 are set as the timing signals Tsw101 and Tsw102, respectively.

Next, operation of the switch circuit SC101 of the related art, which is constituted as described above, will be described.

In FIGS. 30A to 30F, timing diagrams of the switch circuit SC101 is illustrated.

FIGS. 30A, 30B, 30C, 30D, 30E and 30F illustrate the light emission signal DATA, the timing signal Tsw101, the timing signal Tsw102, current Icnt supplied to the gate Vcnt of the MOS transistor Q102, the gate voltage VCNT of the MOS transistor Q102, and the output current Iout output from the current drive circuit DR101, respectively.

As illustrated in FIGS. 30A to 30F, the timing signal Isw101 has the same phase as that of the light emission signal DATA, and the timing signal Tsw102 has an opposite phase to that of the light emission signal DATA.

First, when the light emission signal DATA is in a phase PH101, the light emission signal DATA is a signal that instructs suspension of output of the output current Iout, and the switches SW101 and SW102 are in the open state and the closed state in accordance with the timing signals Tsw101 and Tsw102, respectively. At this time, since the MOS transistor Q102 has the gate voltage VCNT grounded to 0 V by the switch SW102 and is thereby in the OFF state, the output current Iout does not flow.

Next, when the light emission signal DATA enters a phase PH102, the light emission signal DATA becomes a signal that instructs output of the output current Iout, and the switch SW101 turns to the closed state and the switch SW102 turns to the open state. Between the drain and source of the MOS transistor Q101, current IDS101 according to the gate-source voltage of the MOS transistor Q101 flows. A portion of the current IDS101 flowing between the drain and source of the MOS transistor Q101 flows to the constant current source I101 and the rest of the current IDS101 is supplied to the gate Vcnt of the MOS transistor Q102. The current Icnt supplied to the gate Vcnt causes the gate voltage VCNT of the MOS transistor Q102 to increase. As a result, the MOS transistor Q102 turns to the ON state, and the output current Iout flows.

When the total capacity of the gate Vcnt of the MOS transistor Q102 and a constant current value of the constant current source I101 are denoted by Cp and IC101, respectively, an increase ΔV1 in the gate voltage VCNT of the MOS transistor Q102 per time Δt can be expressed by the formula (1) below. Note that, although, in reality, the current IDS101 flowing between the drain and source of the MOS transistor Q101 is expressed by a function depending on the gate-source voltage of the MOS transistor Q101, the current IDS101 is assumed to be a fixed value in the formula for simplicity.

$$\Delta V1=(IDS101-IC101)\times \Delta t/Cp \qquad (1)$$

Finally, when the gate voltage VCNT of the MOS transistor Q102 reaches a settled voltage Vs corresponding to the bias voltage VB1, all current of the current IDS101 flowing between the drain and source of the MOS transistor Q101 flows to the constant current source I101 and the gate voltage VCNT of the MOS transistor Q102 settles to the settled voltage Vs. The MOS transistor Q102 turns to a state of outputting the output current Iout corresponding to the settled voltage Vs.

Repeating the phases PH101 and PH102 causes the output current Iout of the MOS transistor Q102 to become intermittent current.

SUMMARY

In order to switch the output current Iout of the MOS transistor Q102 at high speed, the gate voltage VCNT of the MOS transistor Q102 is required to be increased rapidly. However, since, in the circuit of the related art, as indicated by the formula (1), only a portion of the current IDS101 flowing between the drain and source of the MOS transistor Q101 contributes to increase in the gate voltage VCNT of the MOS transistor Q102, switching the output current Iout efficiently and at high speed has been made difficult.

Accordingly, the present invention has been made in view of the unsolved problems of the related art, and an object of the present invention is to provide a switch circuit and a laser irradiation device using the switch circuit that are capable of switching output current efficiently and at high speed.

In order to achieve the above-described object, a switch circuit according to one aspect of the present invention includes: a first transistor one end of which is coupled to a first power supply and to the control terminal of which predetermined bias voltage is input; a first switch coupled between the first power supply and the one end of the first transistor or one end of which is coupled to the other end of the first transistor; a second transistor coupled between an output terminal and a second power supply; and a current adjustment circuit coupled to a connection point between an end of a whole of the first transistor and the first switch connected in series on an opposite side to the first power supply and a control terminal of the second transistor and configured to perform adjustment in such a way as to prevent current from flowing from the first transistor to the second power supply after the first switch turns on until the second transistor turns on.

A laser irradiation device according to another aspect of the present invention includes a switch circuit according to the above-described aspect and a laser diode connected to the output terminal.

One aspect of the present invention enables output current to be switched efficiently and at high speed.

BRIEF DESCRIPTION OF DRAWINGS

FIGS. 30A to 30F are examples of timing diagrams of the switch circuit.

DETAILED DESCRIPTION

In the following detailed description, numerous specific details are set forth to provide a thorough understanding of the embodiments of the present invention. However, it is apparent that other embodiments can be practiced without being limited to such specific, concrete configurations. The following embodiments do not limit the invention according to the claims and include all combinations of characteristic configurations described in the embodiments.

Embodiments of the present invention will now be described with reference to the drawings. In the following illustration of the drawings, the same signs are assigned to the same constituent elements. However, the drawings are schematic, where a relation between thickness and planar dimensions, ratios of thickness among respective layers, and the like are different from actual ones.

First Embodiment

First, a first embodiment of a switch circuit according to the present invention will be described. In the first embodiment, a case where, as illustrated in FIG. 1, the switch circuit according to the present invention is applied to a laser irradiation device will be described.

Figure 1:
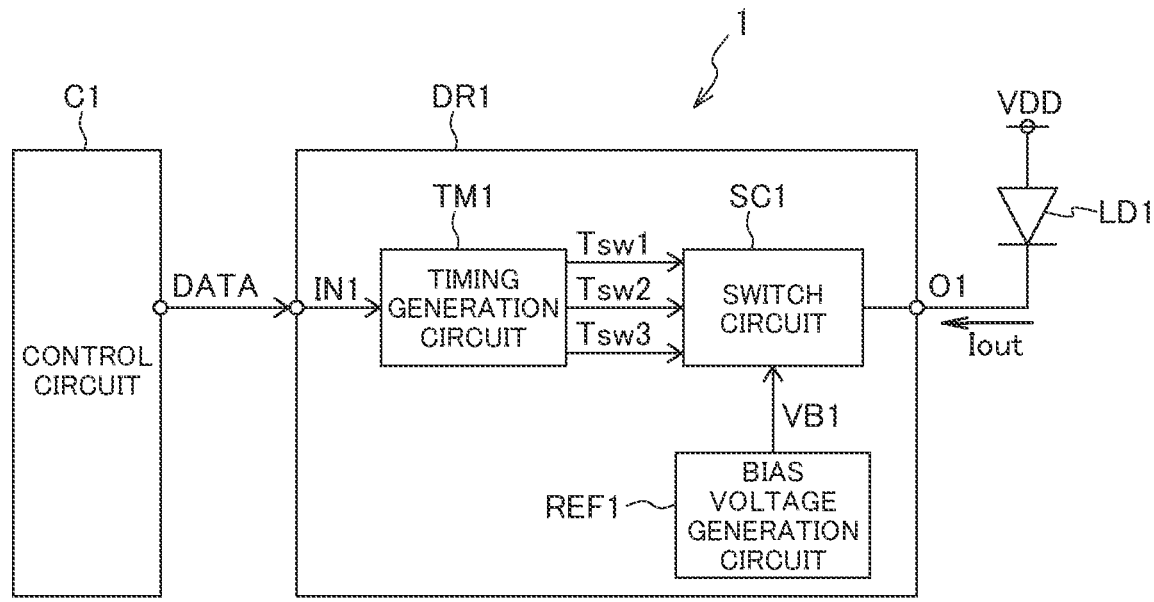
FIG. 1 is a block diagram illustrative of an example of a laser irradiation device according to a first embodiment of the present invention.

As illustrated in FIG. 1, a laser irradiation device 1 includes a control circuit C1, a current drive circuit DR1, and a laser diode LD1. To an output terminal O1 of the current drive circuit DR1, the cathode of the laser diode LD1 is connected. The anode of the laser diode LD1 is connected to a power supply line VDD.

The control circuit C1 outputs a light emission signal DATA that indicates timings of driving current. The light emission signal DATA is a signal that is at the H level when current is output and at the L level when current is not output.

The current drive circuit DR1 includes a switch circuit SC1, a timing generation circuit TM1 that generates timing signals required for timing control of the switch circuit SC1, and a bias voltage generation circuit REF1 that generates bias voltage VB1 determining the amount of current generated by the switch circuit SC1. Note that the control circuit C1 and the timing generation circuit TM1 correspond to a control unit.

The light emission signal DATA that is input to an input terminal IN1 of the current drive circuit DR1 is input to the timing generation circuit TM1. The timing generation circuit TM1 generates timing signals Tsw1, Tsw2, and Tsw3 that are required in the switch circuit SC1 from the light emission signal DATA.

Figure 2:
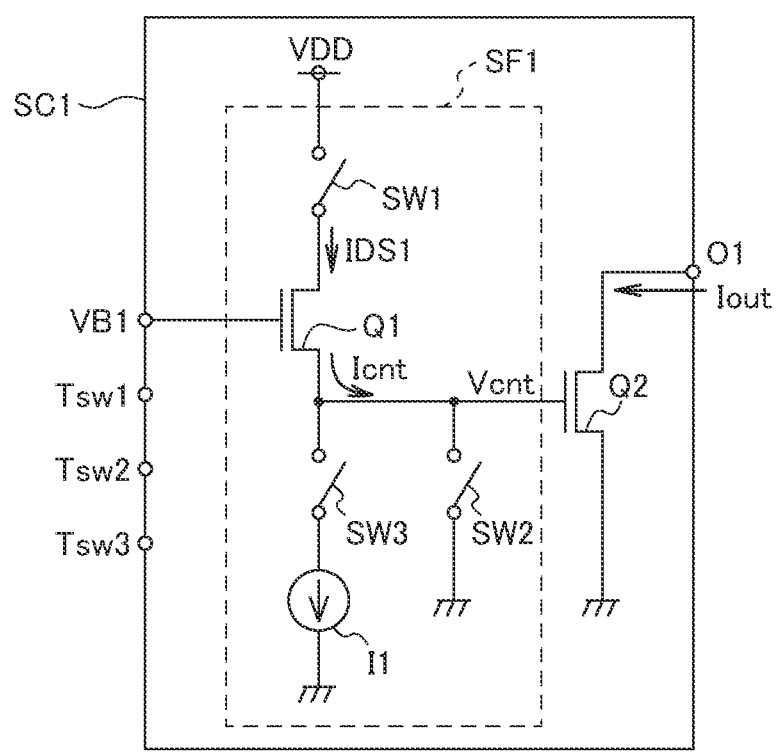
FIG. 2 is a configuration diagram illustrative of an example of a switch circuit according to the first embodiment of the present invention.

FIG. 2 is a configuration diagram illustrative of an example of the switch circuit SC1 according to the first embodiment.

The switch circuit SC1 according to the first embodiment includes an N-type MOS transistor (second transistor) Q2 that switches and outputs current and a current control circuit SF1 that performs switching control of the MOS transistor Q2. The MOS transistor Q2 has the source grounded (second power supply), the drain connected to the output terminal O1, and a gate Vcnt thereof driven by the current control circuit SF1.

The current control circuit SF1 includes an N-type MOS transistor (first transistor) Q1, a constant current source (current source) I1 that serves as a load of the MOS transistor Q1, and a switch (third switch) SW3 that is connected between the source of the MOS transistor Q1 and one end of the constant current source I1. To the gate of the MOS transistor Q1, the bias voltage VB1 generated by the bias voltage generation circuit REF1 is applied. The constant current source I1 and the switch SW3 correspond to a current adjustment circuit.

The switch SW3 is constituted by a MOS transistor or the like and performs switching control of output current Iout. The constant current source I1 has the other end grounded and forms a source follower while the switch SW3 is in the closed state. The MOS transistor Q1 has the drain connected to the power supply line (first power supply) VDD via a switch (first switch) SW1. The switch SW1 is disposed to perform switching control of current flowing between the drain and source of the MOS transistor Q1 and is constituted by a MOS transistor or the like.

The output node of the source follower, that is, the source of the MOS transistor Q1, is connected to the gate Vcnt of the MOS transistor Q2 and also connected to one end of a switch (second switch) SW2 that is constituted by a MOS transistor or the like that can be freely grounded. The other end of the switch SW2 is grounded. A connection point between the source of the MOS transistor Q1 and the gate Vcnt of the MOS transistor Q2 corresponds to a common node.

The switches SW1 to SW3 perform on/off operation in response to the timing signals Tsw1 to Tsw3, which are generated by the timing generation circuit TM1.

Figure 3:
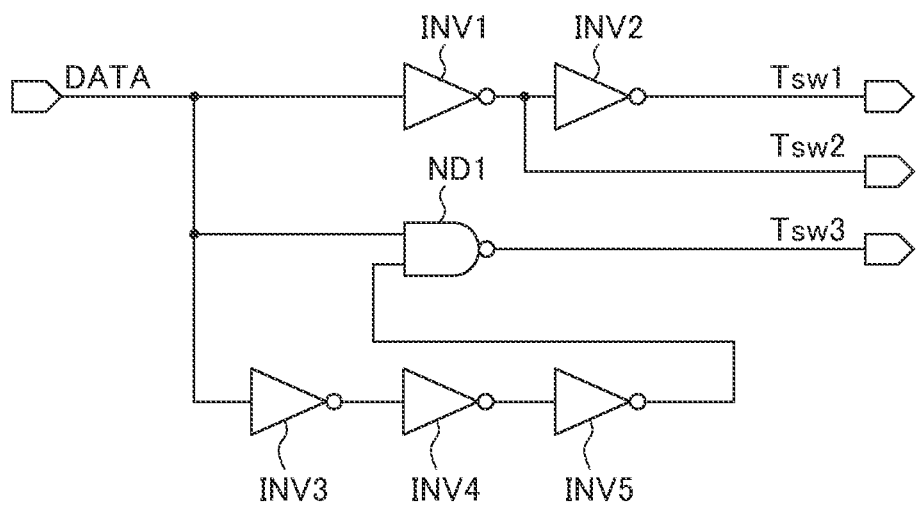
FIG. 3 is a configuration diagram illustrative of an example of a timing generation circuit.
Figure 4:
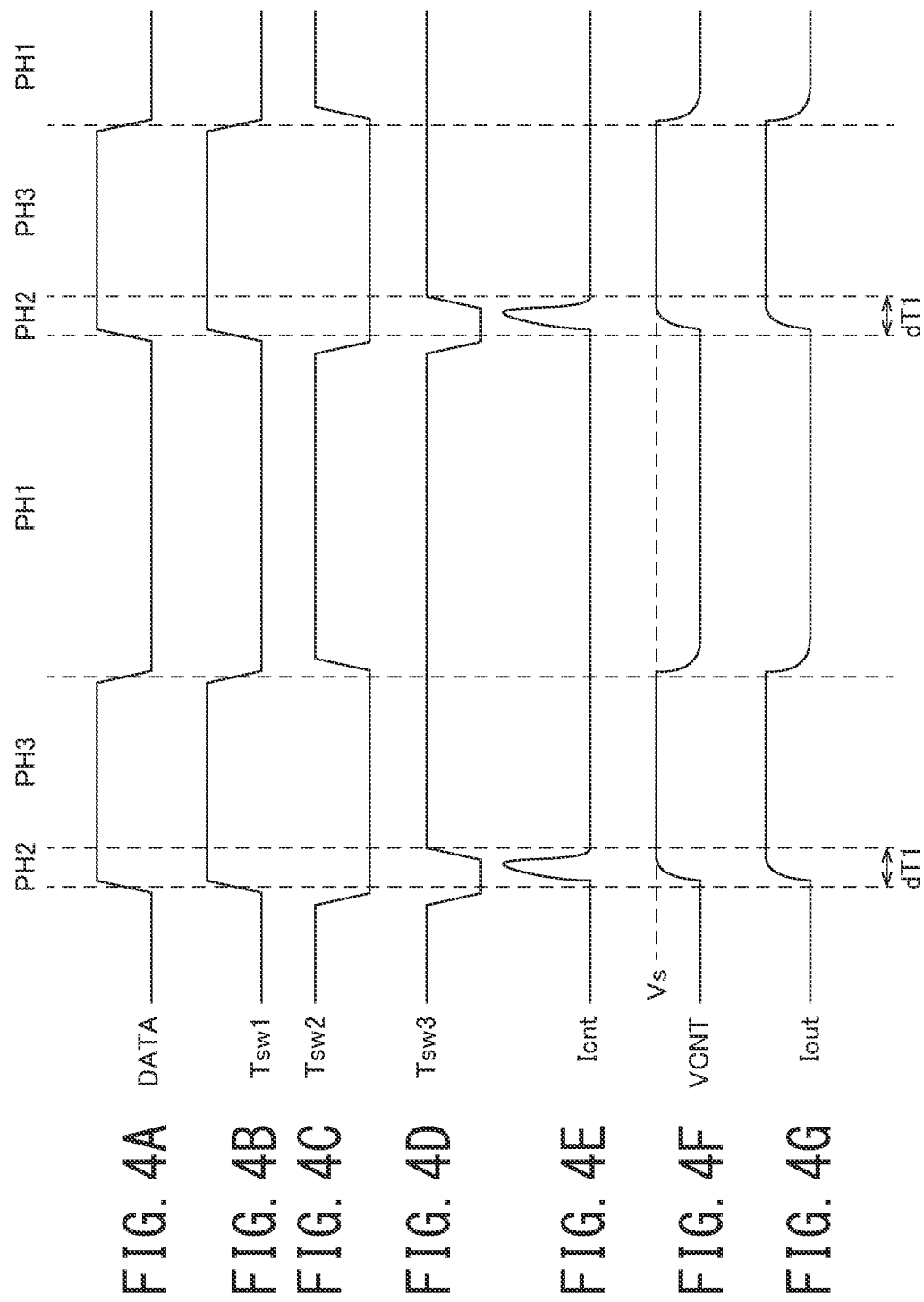
FIGS. 4A to 4G are examples of timing diagrams of the switch circuit.

FIG. 3 is a configuration diagram illustrative of an example of the timing generation circuit TM1.

The timing generation circuit TM1 includes inverter circuits INV1 and INV2 that are connected in series, a NAND circuit ND1, and three inverter circuits INV3 to INV5 that are connected in series. The light emission signal DATA is input to the inverter circuit INV1, one input terminal of the NAND circuit ND1, and the inverter circuit INV3. To the other input terminal of the NAND circuit ND1, the output of the inverter circuit INV5 is input. The output of the inverter circuit INV2, the output of the inverter circuit INV1, and the output of the NAND circuit ND1 serve as the timing signals Tsw1, Tsw2, and Tsw3, respectively.

Next, operation of the switch circuit SC1 according to the first embodiment, which is constituted as described above, will be described.

In FIGS. 4A to 4G, timing diagrams of the switch circuit SC1 are illustrated.

FIGS. 4A, 4B, 4C, 4D, 4E, 4F and 4G illustrate the light emission signal DATA, the timing signal Tsw1, the timing signal Tsw2, the timing signal Tsw3, current Icnt supplied to the gate Vcnt of the MOS transistor Q2, gate voltage VCNT of the MOS transistor Q2, and the output current Tout output from the current drive circuit DR1, respectively.

As illustrated in FIGS. 4A to 4G, the timing signal Tsw1 has the same phase as that of the light emission signal DATA, and the timing signal Tsw2 has an opposite phase to that of the light emission signal DATA. The timing signal Tsw3 is a signal that falls at the same timing as a timing at which the timing signal Tsw1 rises and rises after a lapse of a preset delay time (corresponding to a "predetermined period") dT1 from the rise of the timing signal Tsw1.

As illustrated in FIGS. 4A to 4G, when the light emission signal DATA is in a phase PH1 representing time when current is not output, the switches SW1, SW2, and SW3 are in the open state, the closed sate, and the closed state in response to the timing signals Tsw1 to Tsw3, respectively. At this time, since the MOS transistor Q2 has the gate voltage VCNT grounded to 0 V by the switch SW2 and is thereby in the OFF state, the output current Tout thereof does not flow.

Next, when the light emission signal DATA enters a phase PH2 representing time when current is output, the switch SW1 turns to the closed state and the switches SW2 and SW3 turn to the open state. Between the drain and source of the MOS transistor Q1, current IDS1 according to the gate-source voltage of the MOS transistor Q1 flows. All the current IDS1 is supplied to the gate Vcnt of the MOS transistor Q2, and the gate voltage VCNT thereof increases. As a result, the MOS transistor Q2 turns to the ON state, and the output current Iout flows.

When the total capacity of the gate Vcnt of the MOS transistor Q2 is denoted by Cp, an increase ΔV1 in the gate voltage VCNT of the MOS transistor Q2 per time Δt can be expressed by the formula (2) below. Note that, although, in reality, the current IDS1 according to the gate-source voltage of the MOS transistor Q1 is expressed by a function depending on the gate-source voltage of the MOS transistor Q1, the current IDS1 is assumed to be a fixed value in the formula for simplicity.

$$\Delta V1 = IDS1 \times \Delta t / Cp \quad (2)$$

As indicated by the formula (2), all the current IDS1 flowing between the drain and source of the MOS transistor Q1 contributes to increase in the gate voltage VCNT of the MOS transistor Q2.

Next, when the light emission signal DATA enters a phase PH3, the switch SW3 is switched to the closed state and the switch SW1 maintains the close state and the switch SW2 maintains the open state. A portion of the current IDS1 flowing between the drain and source of the MOS transistor Q1 flows to the constant current source I1 and the rest of the current IDS1 is supplied to the gate Vcnt of the MOS transistor Q2.

Finally, when the gate voltage VCNT of the MOS transistor Q2 reaches a settled voltage Vs corresponding to the bias voltage VB1, all current of the current IDS1 flowing between the drain and source of the MOS transistor Q1 flows to the constant current source I1 and the gate voltage VCNT of the MOS transistor Q2 settles to the settled voltage Vs. The MOS transistor Q2 turns to a state of outputting the output current Iout corresponding to the settled voltage Vs.

Repeating the phases PH1, PH2, and PH3 in sequence causes the output current Iout of the MOS transistor Q2 to become intermittent current.

In the laser irradiation device 1 in the first embodiment, the switch circuit SC1 is configured to prevent current from flowing to the constant current source I1 by opening the switch SW3 during a first certain period (the phase PH2 in FIGS. 4A to 4G, the delay time dT1) when the gate voltage VCNT of the MOS transistor Q2 is increased. Therefore, all the current IDS1 flowing between the drain and source of the MOS transistor Q1 contributes to increasing the gate voltage VCNT of the MOS transistor Q2. As a result, it is possible to increase the gate voltage VCNT of the MOS transistor Q2 more rapidly than the related art, that is, it is possible to perform switching at high speed. Since, on this occasion, it is configured to increase the gate voltage VCNT more rapidly using the current IDS1 that basically flows between the drain and source of the MOS transistor Q1, it is possible to utilize the current IDS1 effectively and perform switching operation efficiently.

Note that, in FIGS. 4A to 4G, the delay time dT1 after the timing signal Tsw1 has risen until the timing signal Tsw3 rises is set at a time equivalent to a required time from a time point at which the switch SW1 is closed to a time point at which the MOS transistor Q2 turns to the ON state. In other words, it is configured to make the current IDS1 flowing between the drain and source of the MOS transistor Q1 contribute to increase in the gate voltage VCNT by keeping the switch SW3 in the open state while the gate voltage VCNT of the MOS transistor Q2 is required to be increased and close the switch SW3 at a point of time at which it is predicted that the gate voltage VCNT has reached the settled voltage Vs and it becomes not necessary to increase the gate voltage VCNT any further. Therefore, it is possible to supply the current IDS1 flowing between the drain and source of the MOS transistor Q1 to the gate Vcnt only when required.

When the delay time dT1 is shorter than the time equivalent to the required time from a time point at which the switch SW1 is closed to a time point at which the MOS transistor Q2 turns to the ON state, the supply of the current IDS1 to the gate Vcnt of the MOS transistor Q2 is caused to start to be limited before the gate voltage VCNT of the MOS transistor Q2 coincides with the settled voltage Vs. Thus, a timing at which the MOS transistor Q2 turns to the ON state is caused to be delayed. Therefore, it is preferable that the delay time dT1 be approximately the required time from a time point at which the switch SW1 is closed to a time point at which the MOS transistor Q2 turns to the ON state, that is, a required time for the gate voltage VCNT to settle to the settled voltage Vs and for the MOS transistor Q2 to become maintained in the ON state.

Figure 5:
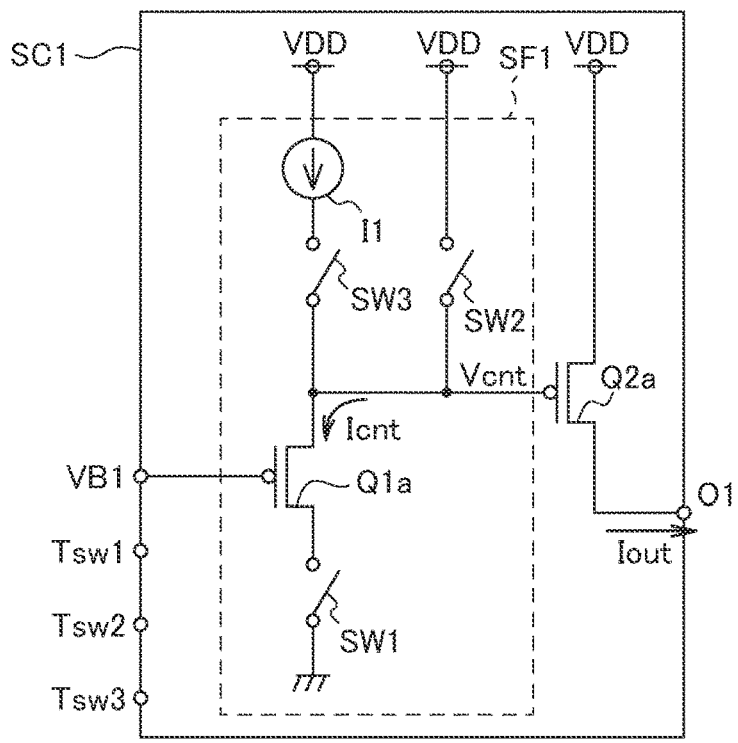
FIG. 5 is a configuration diagram illustrative of a variation of the switch circuit.

Although, in the laser irradiation device 1 in the first embodiment, a circuit example that drives the anode-grounded laser diode LD1 was described, a circuit configuration in which the N-type MOS transistors Q1 and Q2 in FIG. 2 are replaced with P-type MOS transistors Q1a and Q2a, respectively, and holes are used as carriers, as illustrated in FIG. 5 may be configured when a cathode-grounded laser diode is driven.

Figure 6:
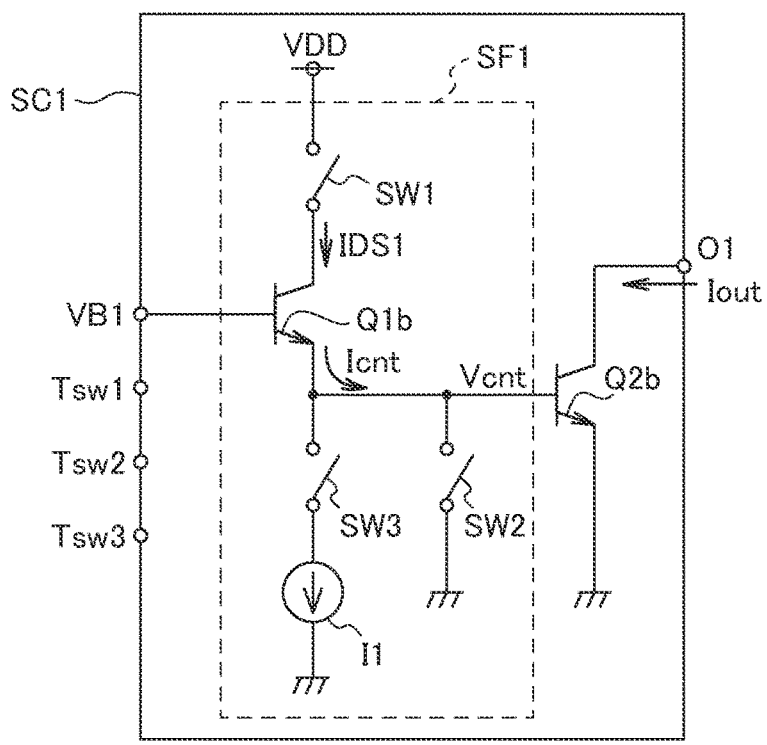
FIG. 6 is a configuration diagram illustrative of another variation of the switch circuit.

In addition, although, in the laser irradiation device 1 in the first embodiment, a case where MOS transistors are used as the MOS transistor Q1 forming a source follower and the MOS transistor Q2 constituting the output stage was described, all the MOS transistors Q1 and Q2 may be replaced with bipolar transistors Q1b and Q2b, as illustrated in FIG. 6 or only either of the MOS transistors Q1 and Q2 may be replaced with a bipolar transistor.

In the laser irradiation device 1, with regard to the switch SW1 and the MOS transistor Q1, which are connected in series, the switch SW1 may be connected to the power supply line VDD as illustrated in FIG. 2 or the MOS transistor Q1 may be connected to the power supply line VDD. Similarly, with regard to the switch SW3 and the constant current source I1, which are connected in series, the switch SW3 may be connected to the MOS transistor Q1 as illustrated in FIG. 2 or the constant current source I1 may be connected to the MOS transistor Q1.

Second Embodiment

Next, a second embodiment of the present invention will now be described.

Figure 7:
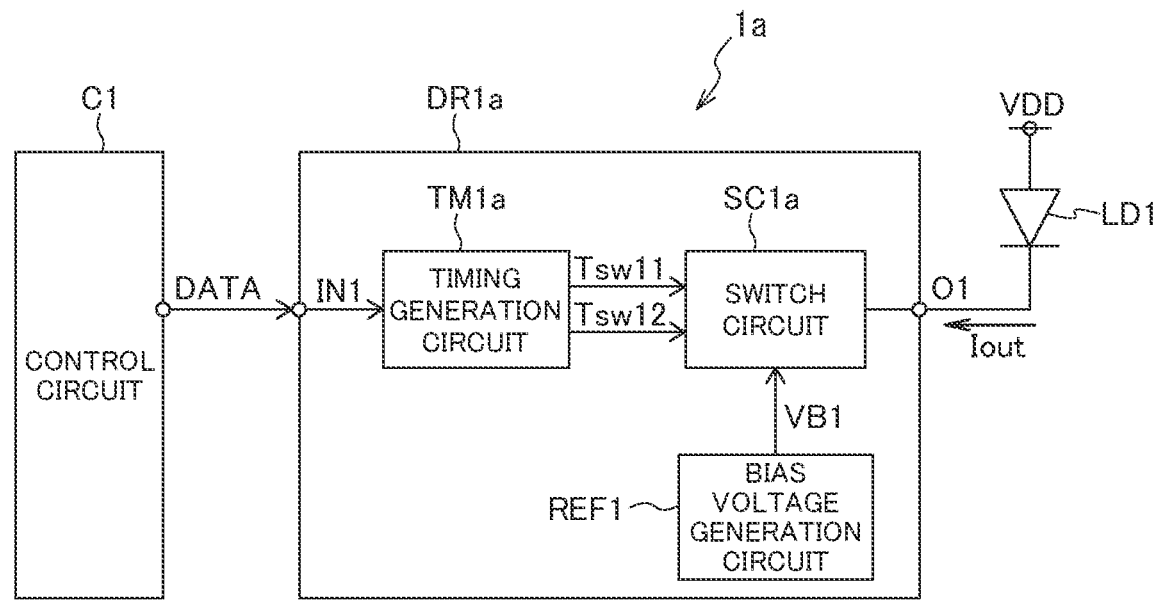
FIG. 7 is a block diagram illustrative of an example of a laser irradiation device according to a second embodiment of the present invention.

FIG. 7 is a block diagram illustrative of an example of a laser irradiation device 1a to which a switch circuit according to the second embodiment of the present invention is applied.

The laser irradiation device 1a is the same as the laser irradiation device 1 according to the first embodiment illustrated in FIG. 1 except a difference in the constitution of the current drive circuit DR1. The same signs are assigned to the same constituent components, and a detailed description thereof will be omitted.

As illustrated in FIG. 7, the laser irradiation device 1a includes a control circuit C1, a current drive circuit DR1a, and a laser diode LD1.

The current drive circuit DR1a in the second embodiment includes a switch circuit SC1a, a timing generation circuit TM1a that generates timing signals required for timing control of the switch circuit SC1a, and a bias voltage generation circuit REF1 that generates bias voltage determining the amount of current generated by the switch circuit SC1a.

A light emission signal DATA that is input to an input terminal IN1 of the current drive circuit DR1a is input to the timing generation circuit TM1a in the current drive circuit DR1a. The timing generation circuit TM1a generates timing signals Tsw11 and Tsw12 that are required in the switch circuit SC1a in accordance with the light emission signal DATA. Note that the control circuit C1 and the timing generation circuit TM1a correspond to a control unit.

Figure 8:
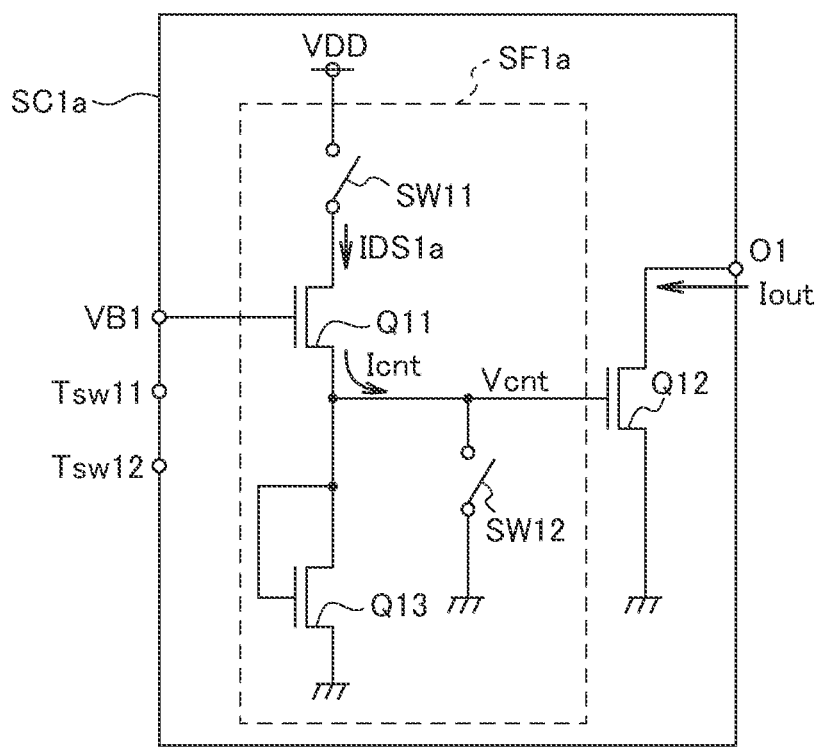
FIG. 8 is a configuration diagram illustrative of an example of a switch circuit according to the second embodiment of the present invention.

FIG. 8 is a configuration diagram illustrative of an example of the switch circuit SC1a according to the second embodiment.

The switch circuit SC1a according to the second embodiment includes an N-type MOS transistor (second transistor) Q12 that switches and outputs current and a current control circuit SF1a that performs switching control of the MOS transistor Q12. The MOS transistor Q12 has the source grounded (second power supply), the drain connected to an output terminal O1, and a gate Vcnt thereof driven by the current control circuit SF1a.

The current control circuit SF1a includes an N-type MOS transistor (first transistor) Q11, an N-type MOS transistor Q13 that serves as a load of the MOS transistor Q11, and a switch (first switch) SW11 that is connected between the MOS transistor Q11 and a power supply line (first power supply) VDD. The source of the MOS transistor Q11 and the drain of the MOS transistor Q13 are connected to each other, and the MOS transistor Q11 and the MOS transistor Q13 thereby form a source follower. To the gate of the MOS transistor Q11, bias voltage VB1 generated by the bias voltage generation circuit REF1 is applied.

The drain and gate of the MOS transistor (diode) Q13 are short-circuited, which forms a diode connection, and the source of the MOS transistor Q13 is grounded. The switch SW11 is constituted by a MOS transistor or the like and performs switching control of current flowing between the drain and source of the MOS transistor Q11. The output node of the source follower, that is, the source of the MOS transistor Q11, is connected to the gate Vcnt of the MOS transistor Q12 and also connected to one end of a switch (second switch) SW12 that is constituted by a MOS transistor or the like that can be freely grounded. The MOS transistor Q13 that is diode-connected corresponds to a current adjustment circuit. A connection point between the source of the MOS transistor Q11 and the gate Vcnt of the MOS transistor Q12 corresponds to a common node.

Figure 9:
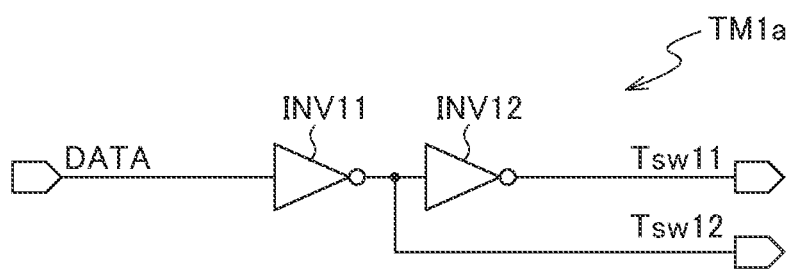
FIG. 9 is a configuration diagram illustrative of an example of a timing generation circuit.
Figure 10:
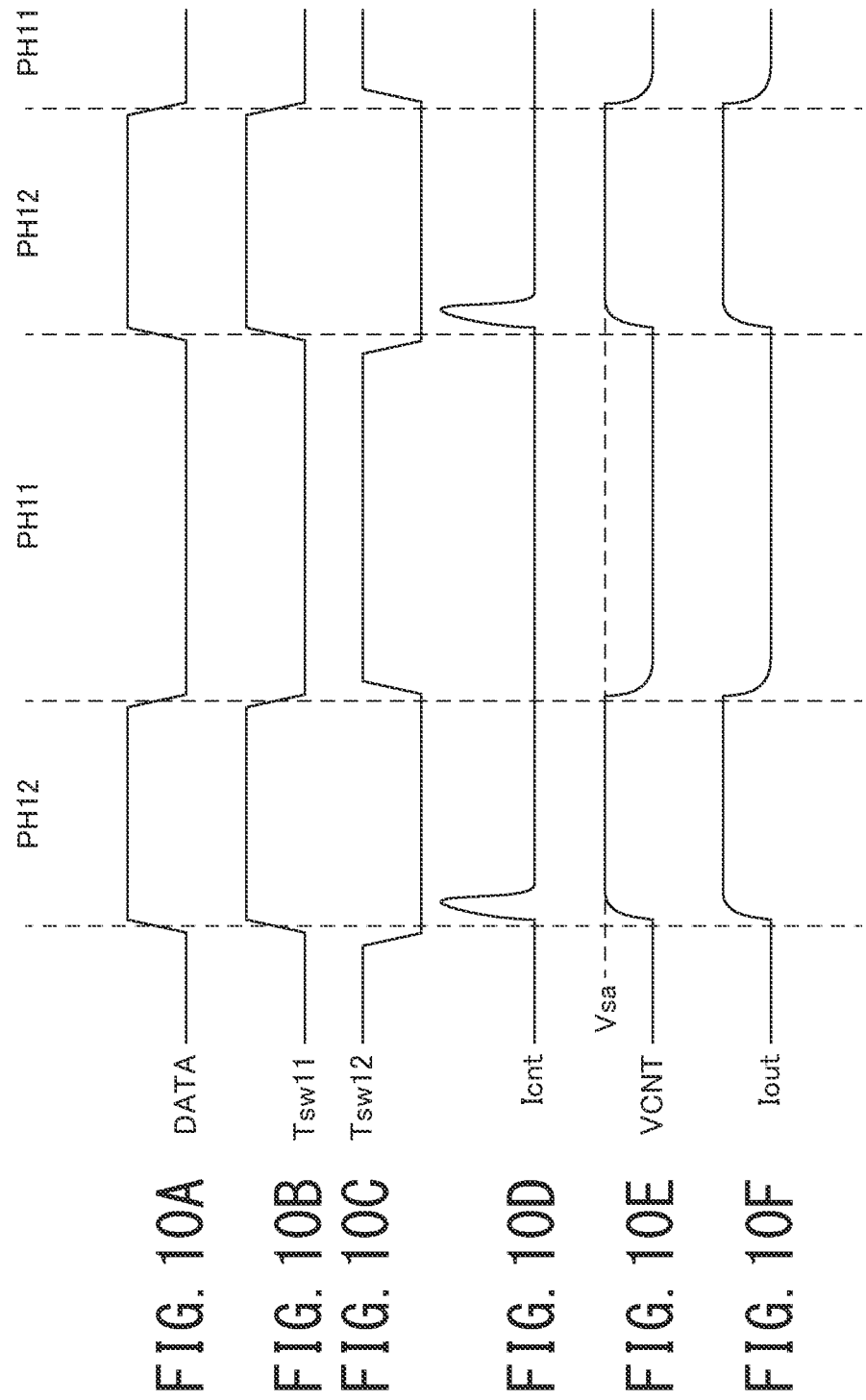
FIGS. 10A to 10F are examples of timing diagrams of the switch circuit.

FIG. 9 is a configuration diagram illustrative of an example of the timing generation circuit TM1a. The timing generation circuit TM1a includes inverter circuits INV11 and INV12 that are connected in series. The light emission signal DATA is input to the inverter circuit INV11, and the output of the inverter circuit INV12 and the output of the inverter circuit INV11 serve as the timing signals Tsw11 and Tsw12, respectively.

Next, operation of the switch circuit SC1a according to the second embodiment, which is constituted as described above, will be described.

In FIGS. 10A to 10F, timing diagrams of the switch circuit SC1a are illustrated.

FIGS. 10A, 10B, 10C, 10D, 10E and 10F illustrate the light emission signal DATA, the timing signal Tsw11, the timing signal Tsw12, current Icnt supplied to the gate Vcnt of the MOS transistor Q12, gate voltage VCNT of the MOS transistor Q12, and output current Iout output from the current drive circuit DR1a, respectively.

As illustrated in FIGS. 10A to 10F, the timing signal Tsw11 has the same phase as that of the light emission signal DATA, and the timing signal Tsw12 has an opposite phase to that of the light emission signal DATA.

As illustrated in FIGS. 10A to 10F, when the light emission signal DATA is in a phase PH11 representing time when current is not output, the switches SW11 and SW12 are in the open state and the closed state in response to the timing signals Tsw11 and Tsw12, respectively. At this time, since the MOS transistor Q12 has the gate voltage VCNT grounded to 0 V by the switch SW12 and is thereby in the OFF state, the output current Iout thereof does not flow.

Next, when the light emission signal DATA enters a phase PH12 representing time current is output, the switch SW11 turns to the closed state and the switch SW12 turns to the open state. Between the drain and source of the MOS transistor Q11, current IDS1a according to the gate-source voltage of the MOS transistor Q11 flows. Immediately after the switch SW12 is opened, the gate voltage VCNT of the MOS transistor Q12 is still 0 V, the diode-connected MOS transistor Q13 is in the OFF state, and no current flows through the MOS transistor Q13. Therefore, all the current IDS1a flowing between the drain and source of the MOS transistor Q11 is supplied to the gate Vcnt of the MOS transistor Q12, and the gate voltage VCNT thereof increases.

When the total capacity of the gate Vcnt of the MOS transistor Q12 is denoted by Cpa, an increase $\Delta V1$ in the gate voltage VCNT of the MOS transistor Q12 per time $\Delta t$ can be expressed by the formula (3) below. Note that, although, in reality, the current IDS1a according to the gate-source voltage is expressed by a function depending on the gate-source voltage of the MOS transistor Q11, the current IDS1a is assumed to be a fixed value in the formula for simplicity.

$$\Delta V1 = IDS1a \times \Delta t / Cpa \qquad (3)$$

As indicated by the formula (3), all the current IDS1a flowing between the drain and source of the MOS transistor Q11 contributes to increase in the gate voltage VCNT of the MOS transistor Q12. When the gate voltage VCNT reaches the turn-on voltage of the MOS transistor Q12, the MOS transistor Q12 starts to flow current.

Subsequently, when the gate voltage VCNT of the MOS transistor Q12 reaches the turn-on voltage of the diode-connected MOS transistor Q13, the MOS transistor Q13 turns to the ON state and starts to flow current, and, finally, when the gate voltage VCNT of the MOS transistor Q12 reaches a settled voltage Vs corresponding to the bias voltage VB1, all current of the current IDS1a flowing between the drain and source of the MOS transistor Q11 flows to the MOS transistor Q13 and the MOS transistor Q12 turns to a state of outputting the output current Iout corresponding to the settled voltage Vs.

Repeating the phases PH11 and PH12 in sequence causes the output current Iout of the MOS transistor Q12 to become intermittent current.

In the laser irradiation device 1a in the second embodiment, all of the current IDS1a flowing between the drain and source of the MOS transistor Q11 contributes to increasing the gate voltage VCNT of the MOS transistor Q12 during a period for which the MOS transistor Q13 is in the OFF state within a period for which the gate voltage VCNT of the MOS transistor Q12 is increased, in the switch circuit SC1a. As a result, it is possible to increase the gate voltage VCNT of the MOS transistor Q12 more rapidly than the related art, that is, it is possible to perform switching at high speed. Since, on this occasion, it is configured to increase the gate voltage VCNT more rapidly using the current IDS1a that basically flows between the drain and source of the MOS transistor Q11, it is possible to perform switching operation efficiently.

The MOS transistor Q13 preferably has a property of turning to the ON state at the same timing as a timing at which the MOS transistor Q12 turns from the OFF state to the ON state. After the MOS transistor Q12 has turned to the ON state and the gate voltage VCNT has settled to the settled voltage Vs, it is not necessary to supply the current IDS1a flowing between the drain and source of the MOS transistor Q11 to the gate Vcnt of the MOS transistor Q12. Therefore, the MOS transistor Q13 preferably turns to the ON state at a point of time when a time equivalent to a required time from a time point at which the switch SW11 turns to the closed state to a time point at which the MOS transistor Q12 turns to the ON state has passed since a point of time at which the switch SW11 turned to the closed state. That is, the MOS transistor Q13 only has to have the same property as the MOS transistor Q12.

Figure 11:
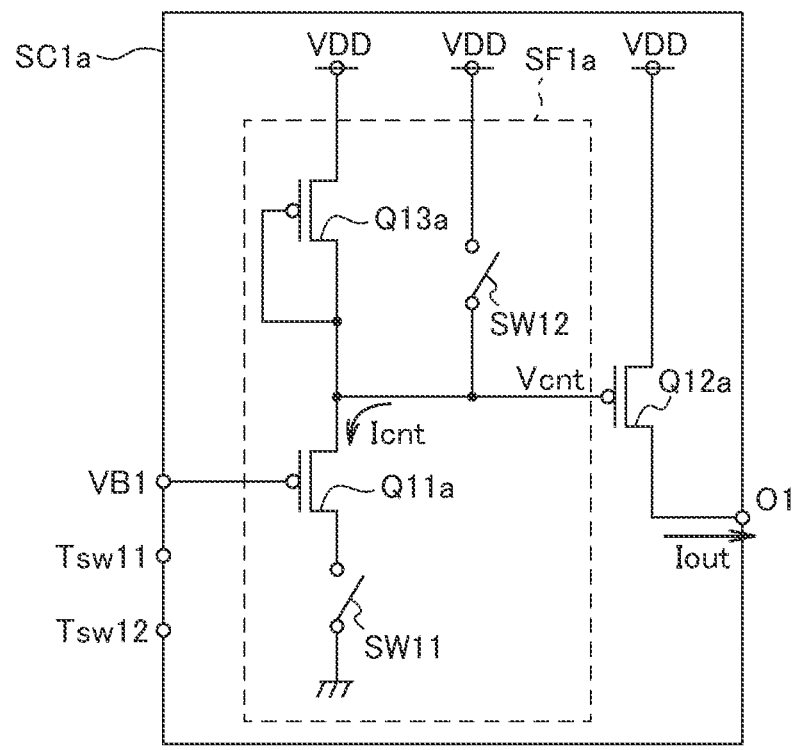
FIG. 11 is a configuration diagram illustrative of a variation of the switch circuit.

Note that, although, in the laser irradiation device 1a in the second embodiment, a circuit example that drives the anode-grounded laser diode LD1 was described, a circuit configuration in which the N-type MOS transistors Q11, Q12, and Q13 in FIG. 8 are replaced with P-type MOS transistors Q11a, Q12a, and Q13a, respectively, and holes are used as carriers, as illustrated in FIG. 11 may be configured when a cathode-grounded laser diode is driven.

Figure 12:
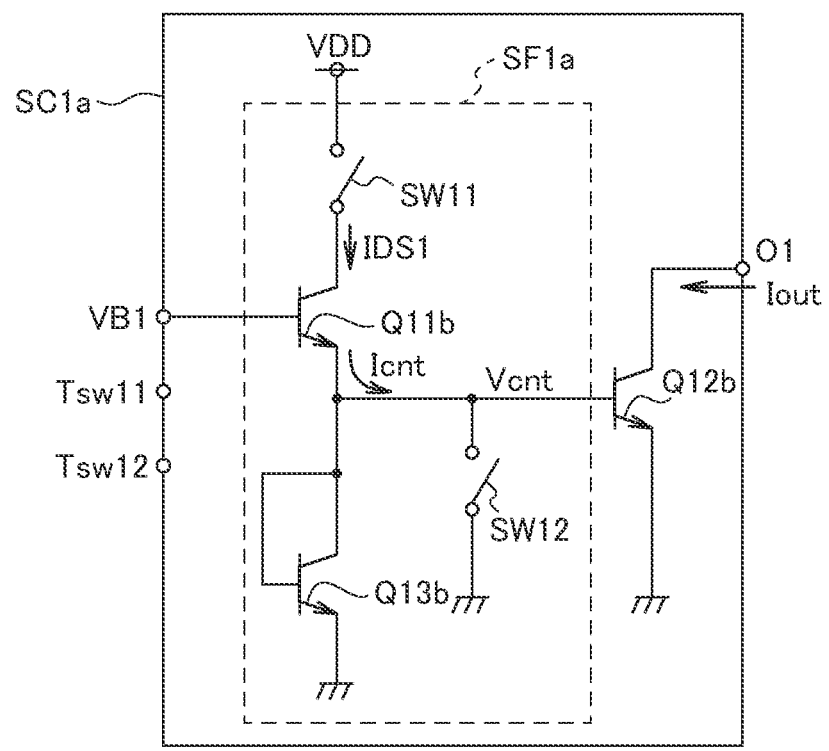
FIG. 12 is a configuration diagram illustrative of another variation of the switch circuit.

In addition, although, in the laser irradiation device 1a in the second embodiment, a case where MOS transistors are used as the MOS transistor Q11 forming a source follower, the MOS transistor Q12 constituting the output stage, and the diode-connected MOS transistor Q13 was described, all the MOS transistors Q11, Q12, and Q13 may be replaced with bipolar transistors Q11b, Q12b, and Q13b, as illustrated in FIG. 12 or only some of the MOS transistors Q11, Q12, and Q13 may be replaced with a bipolar transistor(s).

Further, in the laser irradiation device 1a in the second embodiment, with regard to the switch SW11 and the MOS transistor Q11, which are connected in series, the switch SW11 may be connected to the power supply line VDD as illustrated in FIG. 8 or the MOS transistor Q11 may be connected to the power supply line VDD.

Third Embodiment

Next, a third embodiment of the present invention will now be described.

A laser irradiation device according to the third embodiment is the same as the laser irradiation device 1a according to the second embodiment except a difference in that a switch circuit SC1b is different from the switch circuit SC1a in the current drive circuit DR1a of the laser irradiation device 1a illustrated in FIG. 7.

Figure 13:
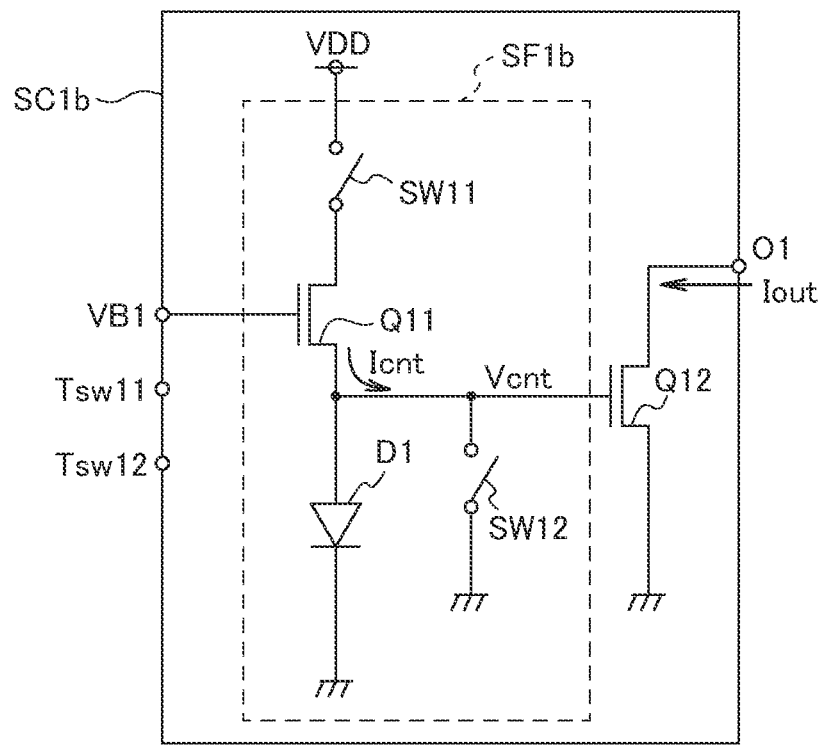
FIG. 13 is a configuration diagram illustrative of an example of a switch circuit according to a third embodiment of the present invention.

The switch circuit SC1b in the third embodiment includes a different current control circuit from the current control circuit SF1a in the switch circuit SC1a in the second embodiment, as illustrated in FIG. 13.

A current control circuit SF1b in the third embodiment is a current control circuit in which a diode D1 that is a diode element (current adjustment circuit) is disposed in place of a diode-connected MOS transistor Q13. That is, the source of a MOS transistor (first transistor) Q11 and the anode of the diode D1, which serves as a load, are connected to each other, and the MOS transistor Q11 and the diode D1 thereby form a source follower. The cathode of the diode D1 is grounded. To the gate of the MOS transistor Q11, bias voltage VB1 generated by a bias voltage generation circuit REF1 is applied.

Note that a switch (first switch) SW11 and a switch (second switch) SW12 perform on/off operation in response to timing signals Tsw11 and Tsw12, respectively, as with the second embodiment.

Therefore, the same advantageous effects as those of the above-described second embodiment can also be achieved in this case.

Note that, the diode D1 preferably has a property of voltage thereacross reaching a turn-on voltage at the same timing as a timing at which the MOS transistor Q12 turns to the ON state.

Figure 14:
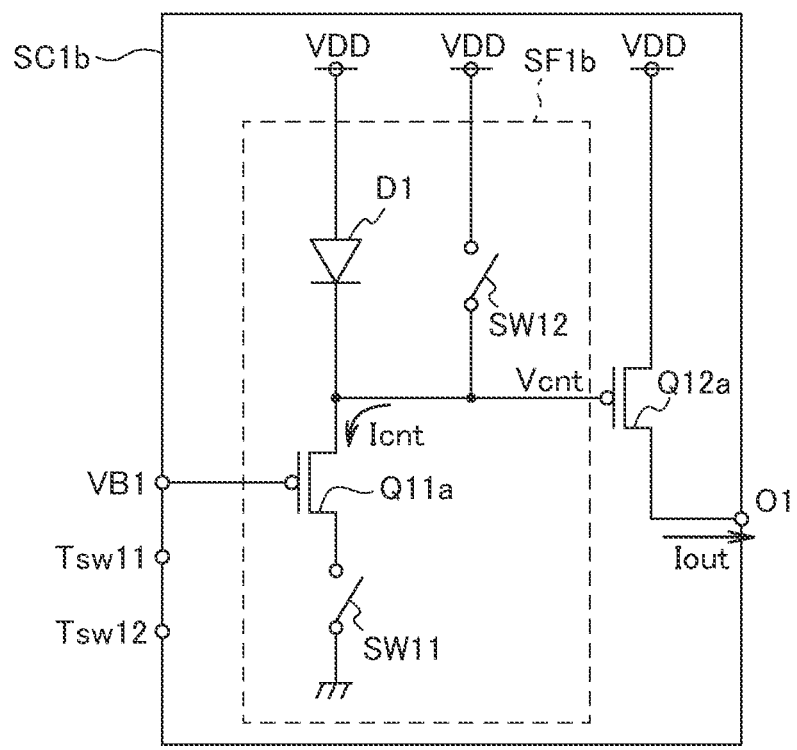
FIG. 14 is a configuration diagram illustrative of a variation of the switch circuit.

Although, in the switch circuit SC1b in the third embodiment, a circuit example that drives an anode-grounded laser diode LD1 was described as illustrated in FIG. 13, a circuit configuration in which the N-type MOS transistors Q11 and Q12 in FIG. 13 are replaced with P-type MOS transistors Q11a and Q12a, respectively, and holes are used as carriers, as illustrated in FIG. 14 may be configured when a cathode-grounded laser diode is driven.

Fourth Embodiment

Next, a fourth embodiment of the present invention will now be described.

Figure 15:
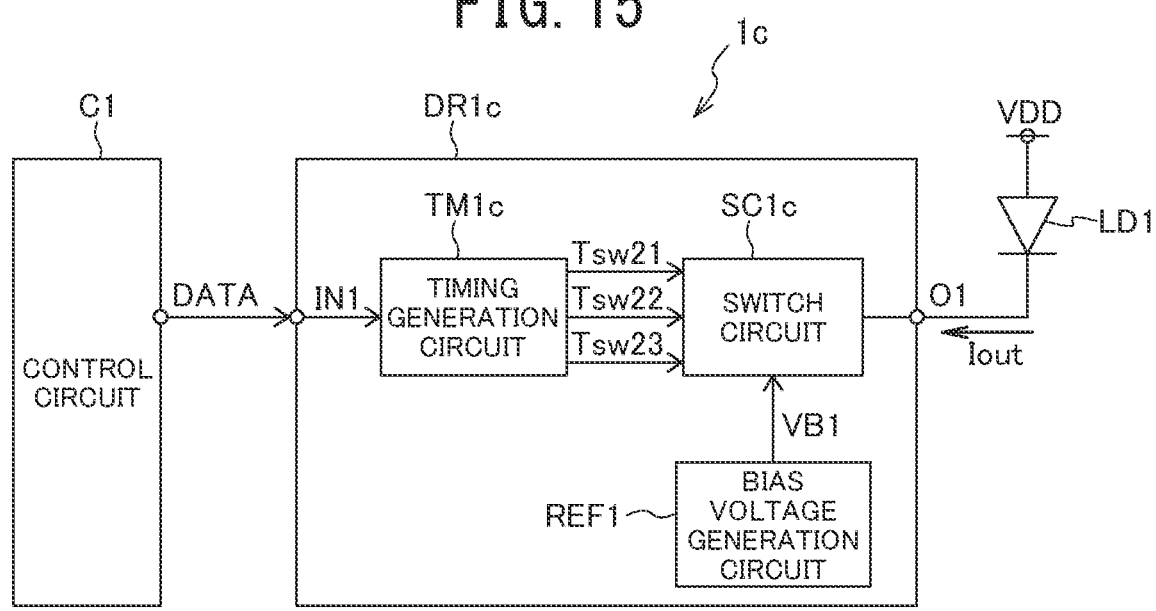
FIG. 15 is a block diagram illustrative of an example of a laser irradiation device according to a fourth embodiment of the present invention.

FIG. 15 is a block diagram illustrative of an example of a laser irradiation device 1c to which a switch circuit according to the fourth embodiment of the present invention is applied.

The laser irradiation device 1c is the same as the laser irradiation device 1 according to the first embodiment illustrated in FIG. 1 except a difference in the constitution of the current drive circuit DR1. The same signs are assigned to the same constituent components, and a detailed description thereof will be omitted.

As illustrated in FIG. 15, the laser irradiation device 1c includes a control circuit C1, a current drive circuit DR1c, and a laser diode LD1. To an output terminal O1, the cathode of the laser diode LD1 is connected. The anode of the laser diode LD1 is connected to a power supply line VDD.

The current drive circuit DR1c includes a switch circuit SC1c, a timing generation circuit TM1c that generates timing signals required for timing control of the switch circuit SC1c, and a bias voltage generation circuit REF1 that generates bias voltage VB1 determining the amount of current generated by the switch circuit SC1c.

A light emission signal DATA that is input to an input terminal IN1 of the current drive circuit DR1c is input to the timing generation circuit TM1c. The timing generation circuit TM1c generates timing signals Tsw21, Tsw22, and Tsw23 that are required in the switch circuit SC1c from the light emission signal DATA. Note that the control circuit C1 and the timing generation circuit TM1c correspond to a control unit.

Figure 16:
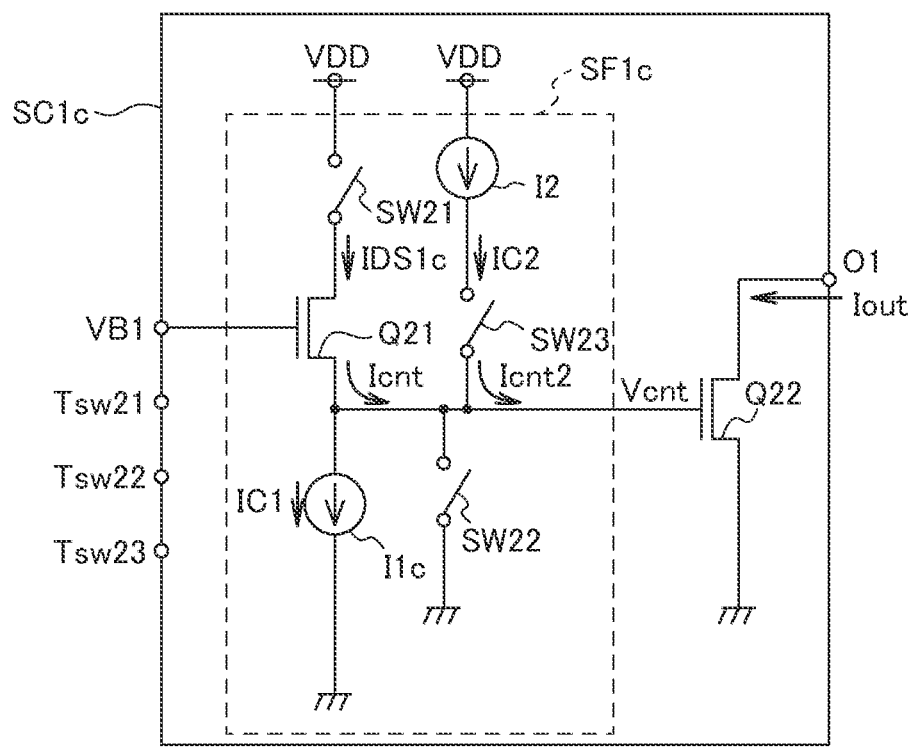
FIG. 16 is a configuration diagram illustrative of an example of a switch circuit according to the fourth embodiment of the present invention.

FIG. 16 is a configuration diagram illustrative of an example of the switch circuit SC1c according to the fourth embodiment. The switch circuit SC1c according to the fourth embodiment includes an N-type MOS transistor (second transistor) Q22 that switches and outputs current and a current control circuit SF1c that performs switching control of the MOS transistor Q22. The MOS transistor Q22 has the source grounded (second power supply), the drain connected to the output terminal O1, and a gate Vcnt thereof driven by the current control circuit SF1c.

The current control circuit SF1c includes an N-type MOS transistor (first transistor) Q21, a constant current source (current source) I1c that serves as a load of the MOS transistor Q21, and a switch (first switch) SW21 that is connected between the MOS transistor Q21 and a power supply line (first power supply) VDD. The source of the MOS transistor Q21 and the constant current source I1c are connected to each other, and the MOS transistor Q21 and the constant current source I1c thereby form a source follower. To the gate of the MOS transistor Q21, the bias voltage VB1 generated by the bias voltage generation circuit REF1 is applied.

The switch SW21 is constituted by a MOS transistor or the like and performs switching control of current flowing between the drain and source of the MOS transistor Q21. The output node of the source follower, that is, the source of the MOS transistor Q21, is connected to the gate Vcnt of the MOS transistor Q22 and also connected to one end of a switch (second switch) SW22 that is constituted by a MOS transistor or the like that can be freely grounded. The current control circuit SF1c further includes a constant current source I2 one end of which is connected to the power supply line VDD and a switch SW23 that is connected between the other end of the constant current source I2 and the gate Vcnt. The constant current source I2 and the switch SW23 correspond to a current adjustment circuit. A connection point between the source of the MOS transistor Q21 and the gate Vcnt of the MOS transistor Q22 corresponds to a common node.

The switches SW21, SW22, and SW23 perform on/off operation in response to the timing signals Tsw21, Tsw22, and Tsw23, which are generated by the timing generation circuit TM1c, respectively.

Figure 17:
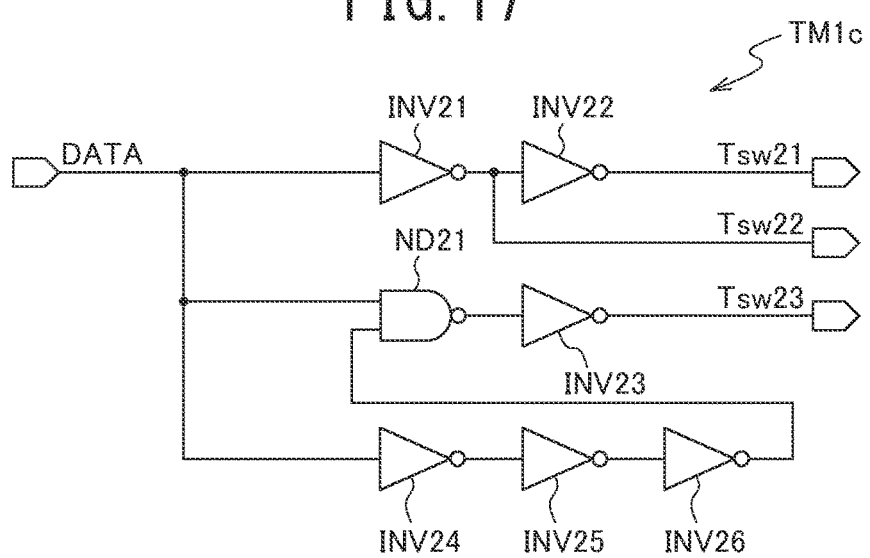
FIG. 17 is a configuration diagram illustrative of an example of a timing generation circuit.
Figure 18:
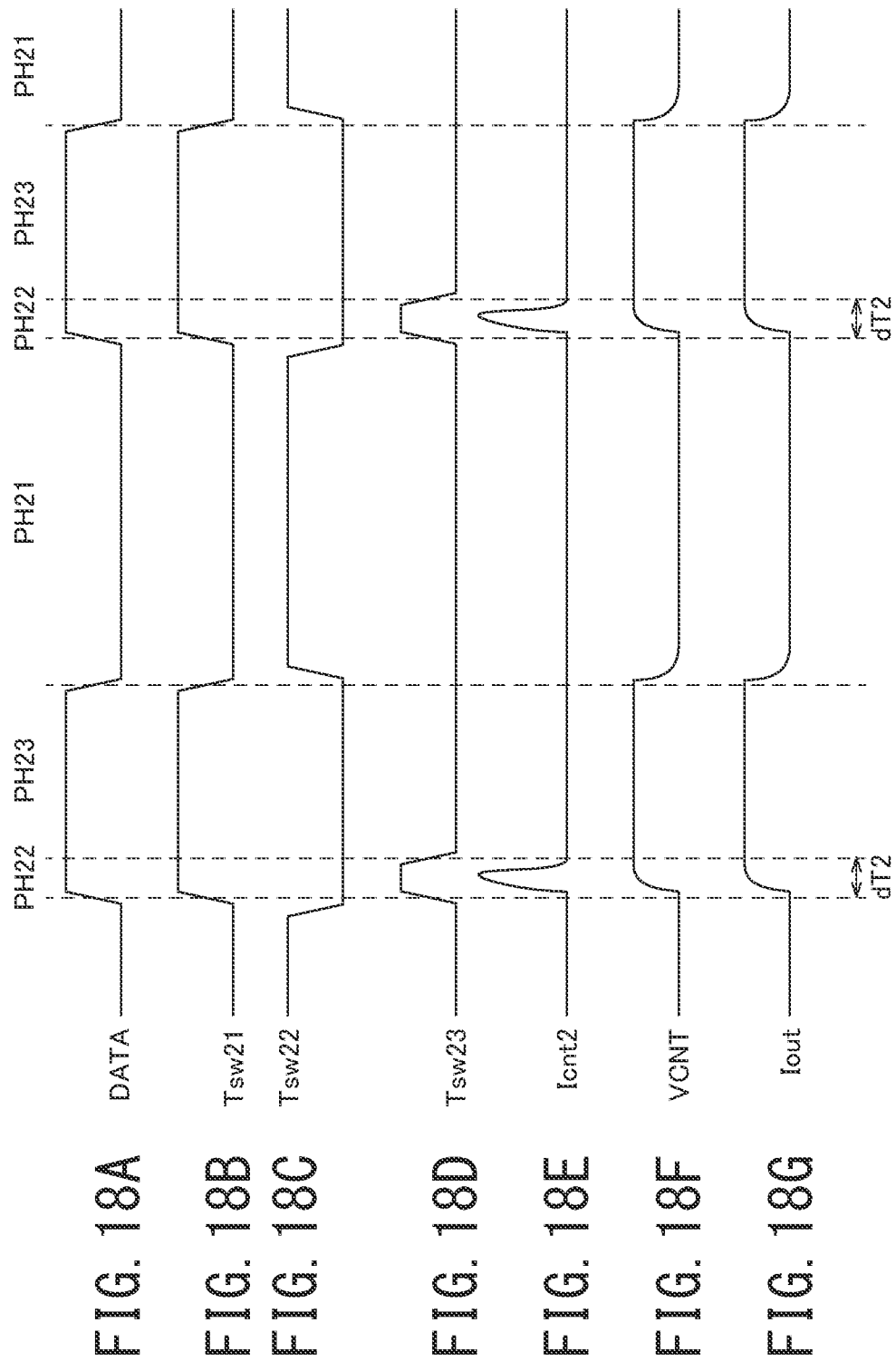
FIGS. 18A to 18G are examples of timing diagrams of the switch circuit.

FIG. 17 is a configuration diagram illustrative of an example of the timing generation circuit TM1c. The timing generation circuit TM1c includes inverter circuits INV21 and INV22 that are connected in series, a NAND circuit ND21 and an inverter circuit INV23 that are connected in series, and inverter circuits INV24, INV25, and INV26 that are connected in series. The light emission signal DATA is input to the inverter circuit INV21, one input terminal of the NAND circuit ND21, and the inverter circuit INV24. To the other input terminal of the NAND circuit ND21, the output of the inverter circuit INV26 is input. The output of the inverter circuit INV22, the output of the inverter circuit INV21, and the output of the inverter circuit INV23 serve as the timing signals Tsw21, Tsw22, and Tsw23, respectively.

Next, operation of the switch circuit SC1c according to the fourth embodiment, which is constituted as described above, will be described.

In FIGS. 18A to 18G, timing diagrams of the switch circuit SC1c are illustrated. FIGS. 18A, 18B, 18C, 18D, 18E, 18F and 18G illustrate the light emission signal DATA, the timing signal Tsw21, the timing signal Tsw22, the timing signal Tsw23, current Icnt2 supplied from the constant current source 12 to the gate Vcnt of the MOS transistor Q22, gate voltage VCNT of the MOS transistor Q22, and output current Iout output from the current drive circuit DR1c, respectively.

As illustrated in FIGS. 18A to 18G, the timing signal Tsw21 has the same phase as that of the light emission signal DATA, and the timing signal Tsw22 has an opposite phase to that of the light emission signal DATA. The timing signal Tsw23 is a signal that rises when the timing signal Tsw21 rises and falls with a certain delay time (corresponding to a "predetermined period") dT2 before the timing signal Tsw21 falls.

As illustrated in FIGS. 18A to 18G, when the light emission signal DATA is in a phase PH21 representing time when current is not output, the switches SW21 and SW23 are in the open state in response to the timing signals Tsw21 and Tsw23, respectively, and the switch SW22 is in the closed state in response to the timing signals Tsw22. At this time, since the MOS transistor Q22 has the gate voltage VCNT grounded to 0 V by the switch SW22 and is thereby in the OFF state, the output current Iout thereof does not flow.

Next, when the light emission signal DATA enters a phase PH22 representing time when current is output, the switches SW21 and SW23 turns to the closed state and the switch SW22 turns to the open state. Between the drain and source of the MOS transistor Q21, current IDS1c according to the gate-source voltage of the MOS transistor Q21 flows. A portion of the current IDS1c flowing between the drain and source of the MOS transistor Q21 flows to the constant current source I1c and the rest of the current IDS1c is supplied to the gate Vcnt of the MOS transistor Q22. All current of the constant current source I2 is supplied to the gate Vcnt of the MOS transistor Q22. A portion of the current IDS1c and all of the current flowing through the constant current source I2 causes the gate voltage VCNT of the MOS transistor Q21 to increase. As a result, the MOS transistor Q22 turns to the ON state, and the output current Iout flows.

When the total capacity of the gate Vcnt of the MOS transistor Q22, a constant current value of the constant current source I1c, and a constant current value of the constant current source I2 are denoted by Cpc, IC1, and IC2, respectively, an increase $\Delta V1$ in the gate voltage VCNT of the MOS transistor Q22 per time $\Delta t$ can be expressed by the formula (4) below. Note that, although, in reality, the current IDS1c according to the gate-source voltage is expressed by a function depending on the gate-source voltage of the MOS transistor Q21, the current IDS1c is assumed to be a fixed value in the formula for simplicity.

$$\Delta V1=\{(IDS1c-IC1)+IC2\}\times\Delta t/Cpc \qquad (4)$$

As indicated by the formula (4), in addition to a portion of the current IDS1c flowing between the drain and source of the MOS transistor Q21, all the current IC2 from the constant current source I2 contributes to increase in the gate voltage VCNT of the MOS transistor Q22. When the gate voltage VCNT reaches the turn-on voltage of the MOS transistor Q22, the MOS transistor Q22 starts to flow current. When the gate voltage VCNT of the MOS transistor Q22 reaches a settled voltage Vs corresponding to the bias voltage VB1, the MOS transistor Q22 turns to a state of outputting the output current Iout corresponding to the settled voltage Vs.

Next, when the light emission signal DATA enters a phase PH23, the switch SW23 is switched to the open state and the switches SW21 and SW22 maintain the closed state and the open state, respectively. These states of the switches cause the supply of current from the constant current source I2 to the gate Vcnt of the MOS transistor Q22 to be suspended. Finally, all current of the current IDS1c flowing between the drain and source of the MOS transistor Q21 comes to flow to the constant current source I1c.

Repeating the phases PH21, PH22, and PH23 in this sequence causes the output current Iout of the MOS transistor Q22 to become intermittent current.

In the laser irradiation device 1c in the fourth embodiment, the switch circuit SC1c is configured to close the switch SW23 during a first certain period (a period of the phase PH22 in FIGS. 18A to 18G, the delay time dT2) within a period during which the gate voltage VCNT of the MOS transistor Q22 is increased and thereby make the current from the constant current source I2 injected to the gate Vcnt of the MOS transistor Q22 and contribute to increase in the gate voltage VCNT of the MOS transistor Q22. Therefore, it is possible to increase the gate voltage VCNT of the MOS transistor Q22 more rapidly than a case where only the current IDS1c according to the gate-source voltage of the MOS transistor Q21 is made to contribute to increase in the gate voltage VCNT. In addition, since the current from the constant current source I2 is configured to be supplied only during the first certain period (the period of the phase PH22 in FIGS. 18A to 18G), it is possible to cause switching operation to be performed efficiently without supplying unnecessary current.

Note that the delay time dT2 during which the switch SW23 is set at the closed state is set at a time equivalent to a required time from a time point at which the switch SW21 is closed to a time point at which the MOS transistor Q22 turns to the ON state. In other words, it is configured to make the current from the constant current source I2 contribute to increase in the gate voltage VCNT by keeping the switch SW23 in the closed state only while the gate voltage VCNT of the MOS transistor Q22 is required to be increased and switch the switch SW23 to the open state at a point of time at which it is predicted that the gate voltage VCNT has reached the settled voltage Vs and the MOS transistor Q22 turns to the ON state. When the delay time dT2 is shorter than the required time from a time point at which the switch SW21 is closed to a time point at which the MOS transistor Q22 turns to the ON state, the supply of the current IC2 to the gate Vcnt of the MOS transistor Q22 is caused to be suspended before the gate voltage VCNT of the MOS transistor Q22 increases sufficiently high. Thus, a timing at which the MOS transistor Q22 turns to the ON state is caused to be delayed.

The constant current value of the constant current source I2 only has to be set at a current value that enables the gate voltage VCNT of the MOS transistor Q22 to increase to a sufficiently high level during the delay time dT2.

Note that, in the switch circuit SC1c in the fourth embodiment, a timing at which the switch SW23 is switched to the closed state does not necessarily have to coincide with a timing at which the switch SW21 is switched to the closed state and may slightly differ therefrom. Essentially, as long as the current Icnt2 can be supplied to the gate Vcnt of the MOS transistor Q22 at a timing at which the switch SW21 is switched to the closed state and the current Icnt is supplied to the gate Vcnt of the MOS transistor Q22, a timing at which the switch SW23 is switched to the closed state does not necessarily have to coincide with a timing at which the switch SW21 is switched to the closed state.

Figure 19:
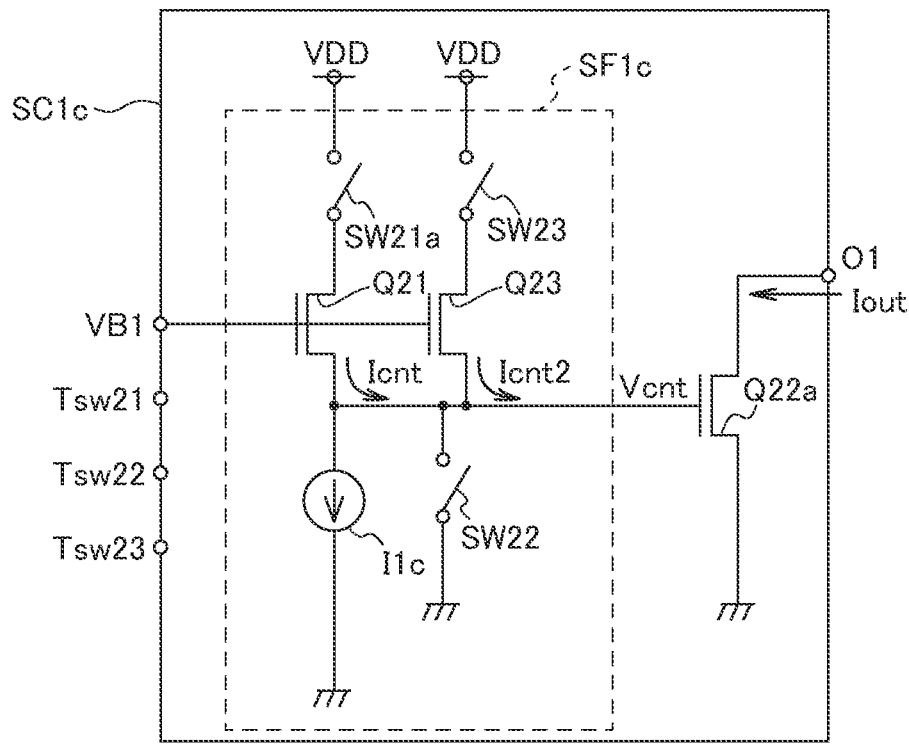
FIG. 19 is a configuration diagram illustrative of a variation of the switch circuit.

In the switch circuit SC1c in the fourth embodiment, a MOS transistor Q23 may be disposed in place of the constant current source I2, as illustrated in FIG. 19. In other words, the switch SW23 and the MOS transistor Q23 that are connected in series are connected between the power supply line VDD and the gate Vcnt of the MOS transistor Q22, and a common bias voltage VB1 is supplied to the gates of the MOS transistors Q21 and Q23.

The switches SW21, SW22, and SW23 are controlled at the same timings as those in the timing diagrams illustrated in FIGS. 18A to 18G.

In this case, in the phase PH21, the gate voltage VCNT of the MOS transistor Q22 becomes 0 V and the current Iout does not flow. In the phase PH22, the current Icnt that is a portion of the current IDS1c flowing through the MOS transistor Q21 is supplied to the gate Vcnt of the MOS transistor Q22 and, only during the period of the delay time dT2, the current Icnt2 flowing through the MOS transistor Q23 is also supplied to the gate Vcnt of the MOS transistor Q22. In the phase PH23, the switches SW22 and SW23 are in the open state and the current Icnt2 flowing through the MOS transistor Q23 is not supplied to the gate Vcnt.

Since, as described above, the switch circuit SC1c that has the constitution illustrated in FIG. 19 perform the same operation as the switch circuit SC1c illustrated in FIG. 16, it is possible to achieve the same advantageous effects.

Figure 20:
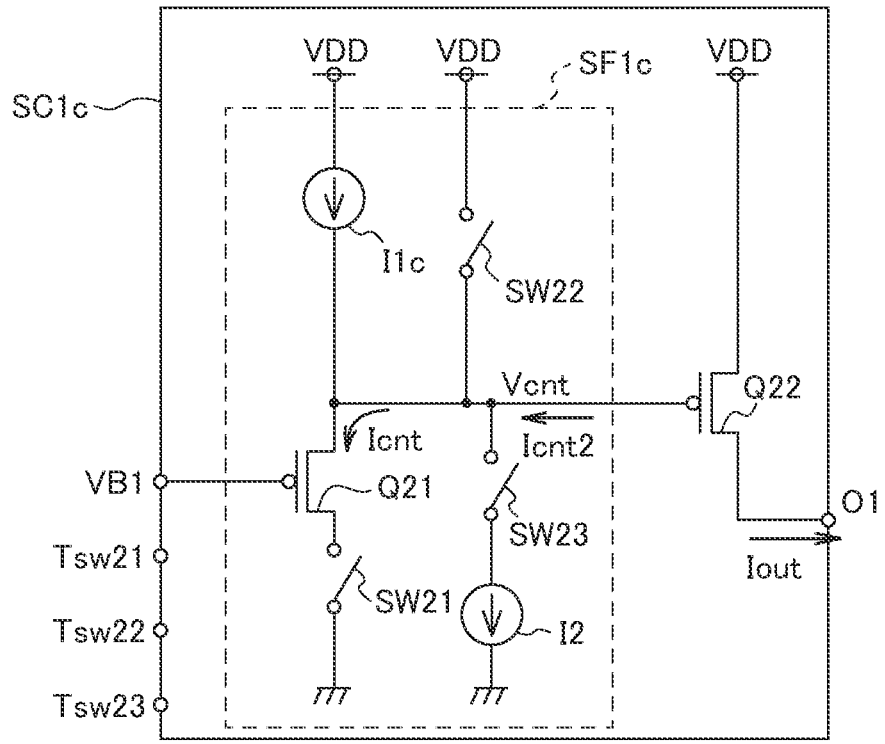
FIG. 20 is a configuration diagram illustrative of another variation of the switch circuit.

Although, in the laser irradiation device 1c illustrated in FIG. 15, a circuit example that drives the anode-grounded laser diode LD1 was described, it is also possible to drive a cathode-grounded laser diode, and, in this case, a circuit configuration in which the N-type MOS transistors Q21 and Q22 in FIG. 16 are replaced with P-type MOS transistors Q21a and Q22a, respectively, and holes are used as carriers, as illustrated in FIG. 20 may be configured.

In the switch circuit SC1c, with regard to the switch SW21 and the MOS transistor Q21, which are connected in series, the switch SW21 may be connected to the power supply line VDD as illustrated in FIG. 16 or, conversely, the MOS transistor Q21 may be configured to be connected to the power supply line VDD.

Fifth Embodiment

Next, a fifth embodiment of the present invention will now be described.

Figure 21:
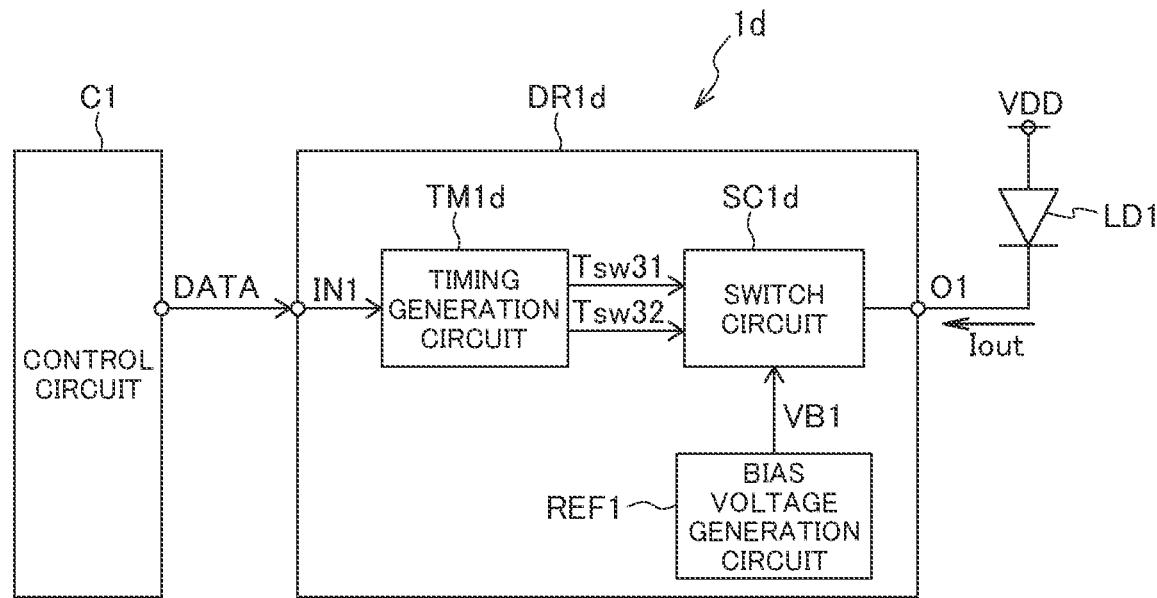
FIG. 21 is a block diagram illustrative of an example of a laser irradiation device according to a fifth embodiment of the present invention.

FIG. 21 is a block diagram illustrative of an example of a laser irradiation device 1d to which a switch circuit according to the fifth embodiment of the present invention is applied.

As illustrated in FIG. 21, the laser irradiation device 1d includes a control circuit C1, a current drive circuit DR1d, and a laser diode LD1. To an output terminal O1 of the current drive circuit DR1d, the cathode of the laser diode LD1 is connected. The anode of the laser diode LD1 is connected to a power supply line VDD.

The control circuit C1 outputs a light emission signal DATA that indicates timings of driving current. The light emission signal DATA is a signal that is at the H level when current is output and at the L level when current is not output.

The current drive circuit DR1d includes a switch circuit SC1d, a timing generation circuit TM1d that generates timing signals required for timing control of the switch circuit SC1d, and a bias voltage generation circuit REF1 that generates bias voltage VB1 determining the amount of current generated by the switch circuit SC1d. Note that the control circuit C1 and the timing generation circuit TM1d correspond to a control unit.

The light emission signal DATA that is input to an input terminal IN1 of the current drive circuit DR1d is input to the timing generation circuit TM1d. The timing generation circuit TM1d generates timing signals Tsw31 and Tsw33 that are required in the switch circuit SC1d from the light emission signal DATA.

Figure 22:
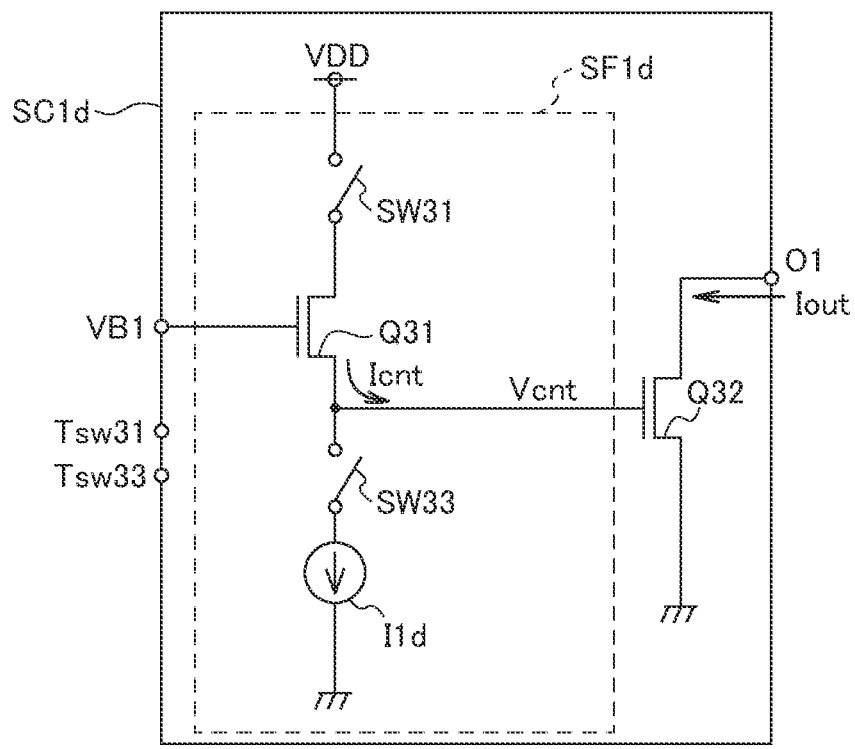
FIG. 22 is a configuration diagram illustrative of an example of a switch circuit according to the fifth embodiment of the present invention.

FIG. 22 is a configuration diagram illustrative of an example of the switch circuit SC1d according to the fifth embodiment.

The switch circuit SC1d according to the fifth embodiment includes an N-type MOS transistor (second transistor) Q32 that switches and outputs current and a current control circuit SF1d that performs switching control of the MOS transistor Q32. The MOS transistor Q32 has the source grounded (second power supply), the drain connected to the output terminal O1, and a gate Vcnt thereof driven by the current control circuit SF1d.

The current control circuit SF1d includes an N-type MOS transistor (first transistor) Q31, a constant current source (current source) I1d that serves as a load of the MOS transistor Q31, and a switch (third switch) SW33 that is connected between the source of the MOS transistor Q31 and one end of the constant current source I1d. To the gate of the MOS transistor Q31, the bias voltage VB1 generated by the bias voltage generation circuit REF1 is applied. The constant current source I1d and the switch SW33 correspond to a current adjustment circuit.

The switch SW33 is constituted by a MOS transistor or the like and performs switching control of output current Tout. The constant current source I1d has the other end grounded and forms a source follower while the switch SW33 is in the closed state. The MOS transistor Q31 has the drain connected to the power supply line (first power supply) VDD via a switch (first switch) SW31. The switch SW31 is disposed to perform switching control of current flowing between the drain and source of the MOS transistor Q31 and is constituted by a MOS transistor or the like.

The output node of the source follower, that is, the source of the MOS transistor Q31, is connected to the gate Vcnt of the MOS transistor Q32. A connection point between the source of the MOS transistor Q31 and the gate Vcnt of the MOS transistor Q32 corresponds to a common node.

The switches SW31 and SW33 perform on/off operation in response to the timing signals Tsw31 and Tsw33, which are generated by the timing generation circuit TM1d, respectively.

Figure 23:
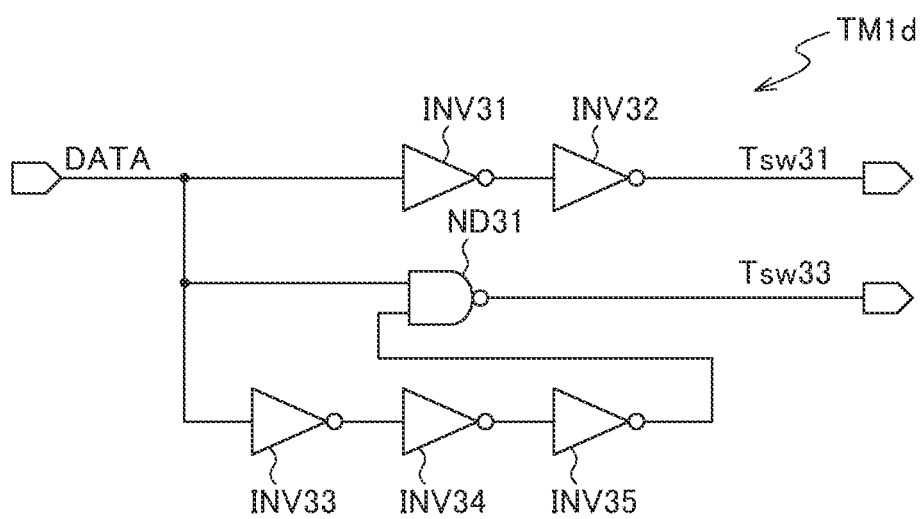
FIG. 23 is a configuration diagram illustrative of an example of a timing generation circuit.
Figure 24:
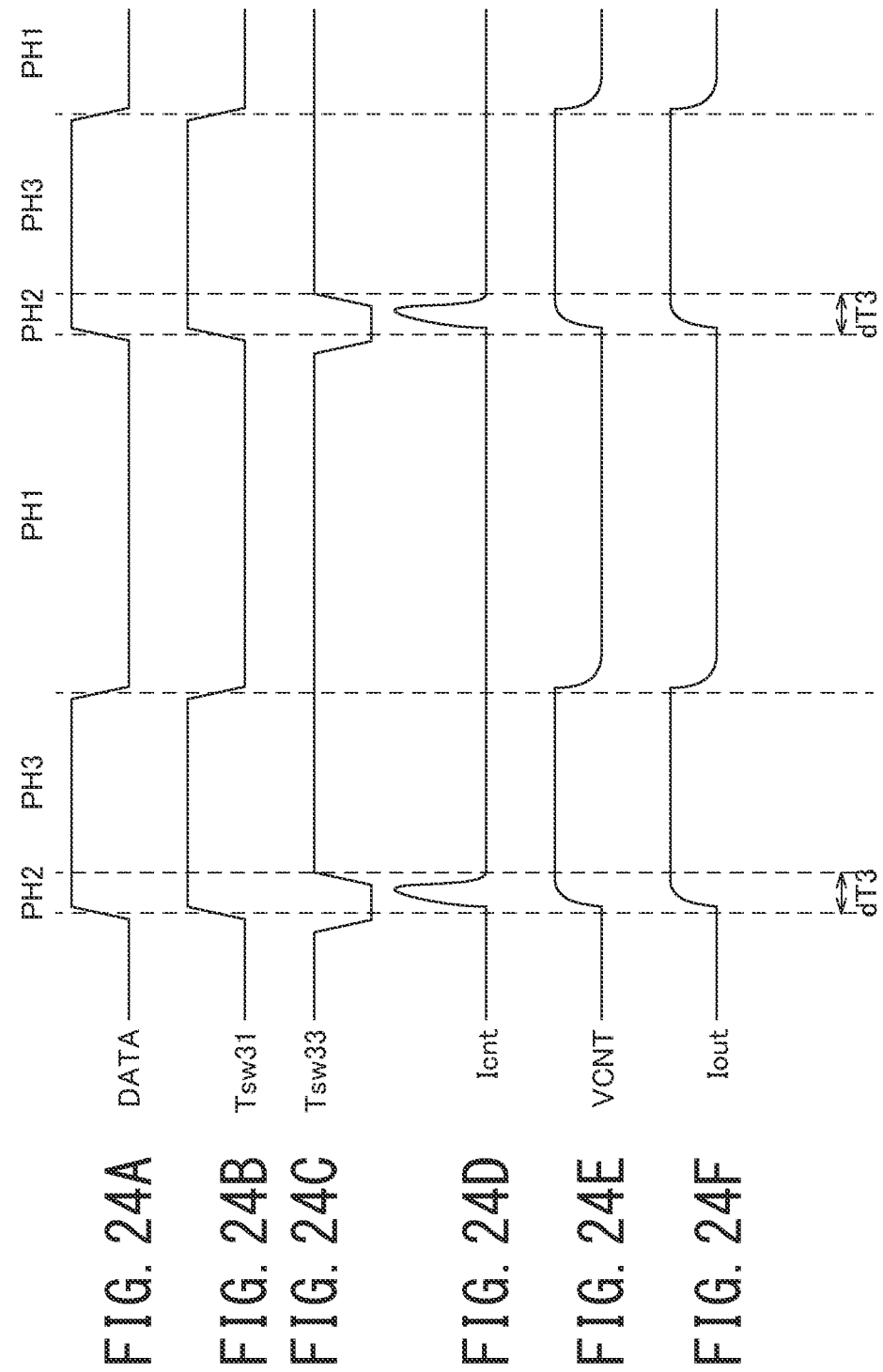
FIGS. 24A to 24F are examples of timing diagrams of the switch circuit.

FIG. 23 is a configuration diagram illustrative of an example of the timing generation circuit TM1d.

The timing generation circuit TM1d includes inverter circuits INV31 and INV32 that are connected in series, a NAND circuit ND31, and three inverter circuits INV33 to INV35 that are connected in series. The light emission signal DATA is input to the inverter circuit INV31, one input terminal of the NAND circuit ND31, and the inverter circuit INV34. To the other input terminal of the NAND circuit ND31, the output of the inverter circuit INV35 is input. The output of the inverter circuit INV31 and the output of the NAND circuit ND31 serve as the timing signals Tsw31 and Tsw33, respectively.

Next, operation of the switch circuit SC1d according to the fifth embodiment, which is constituted as described above, will be described.

In FIGS. 24A to 24F, a timing diagram of the switch circuit SC1d is illustrated.

FIGS. 24A, 24B, 24C, 24D, 24E and 24F illustrate the light emission signal DATA, the timing signal Tsw31, the timing signal Tsw33, current Icnt supplied to the gate Vcnt of the MOS transistor Q32, gate voltage VCNT of the MOS transistor Q32, and output current Iout output from the current drive circuit DR1d, respectively.

As illustrated in FIGS. 24A to 24F, the timing signal Tsw31 has the same phase as that of the light emission signal DATA. The timing signal Tsw33 is a signal that falls at the same timing as a timing at which the timing signal Tsw31 rises and rises after a lapse of a preset delay time (corresponding to a "predetermined period") dT3.

As illustrated in FIGS. 24A to 24F, when the light emission signal DATA is in a phase PH1 representing time current is not output, the switches SW31 and SW33 are in the open state and the closed state in response to the timing signals Tsw31 and Tsw33, respectively. At this time, since the MOS transistor Q32 turns to the OFF state because charges are discharged by the constant current source I1d and the gate voltage VCNT thereof thereby decreases, the output current Tout thereof does not flow.

Next, when the light emission signal DATA enters a phase PH2 representing time when current is output, the switch SW31 turns to the closed state and the switch SW33 turns to the open state. Between the drain and source of the MOS transistor Q31, current IDS1 according to the gate-source voltage of the MOS transistor Q31 flows. All the current IDS1 is supplied to the gate Vcnt of the MOS transistor Q32, and the gate voltage VCNT thereof increases. As a result, the MOS transistor Q32 turns to the ON state, and the output current Tout flows.

When the total capacity of the gate Vcnt of the MOS transistor Q32 is denoted by Cp, an increase $\Delta V1$ in the gate voltage VCNT of the MOS transistor Q32 per time $\Delta t$ can be expressed by the afore-described formula (2). Note that, although, in reality, the current IDS1 according to the gate-source voltage of the MOS transistor Q31 is expressed by a function depending on the gate-source voltage of the MOS transistor Q31, the current IDS1 is assumed to be a fixed value in the formula for simplicity.

As indicated by the afore-described formula (2), all the current IDS1 flowing between the drain and source of the MOS transistor Q31 contributes to increase in the gate voltage VCNT of the MOS transistor Q32.

Next, when the light emission signal DATA enters a phase PH3, the switch SW33 is switched to the closed state and the switch SW31 maintains the closed state. A portion of the current IDS1 flowing between the drain and source of the MOS transistor Q31 flows to the constant current source I1d and the rest of the current IDS1 is supplied to the gate Vcnt of the MOS transistor Q32.

Finally, when the gate voltage VCNT of the MOS transistor Q32 reaches a settled voltage Vs corresponding to the bias voltage VB1, all current of the current IDS1 flowing between the drain and source of the MOS transistor Q31 flows to the constant current source I1d and the gate voltage VCNT of the MOS transistor Q32 settles to the settled voltage Vs. The MOS transistor Q32 turns to a state of outputting the output current Iout corresponding to the settled voltage Vs.

Repeating the phases PH1, PH2, and PH3 in sequence causes the output current Iout of the MOS transistor Q32 to become intermittent current.

In the laser irradiation device 1d in the fifth embodiment, the switch circuit SC1d is configured to prevent current from flowing to the constant current source I1d by opening the switch SW33 during a first certain period (the phase PH2 in FIGS. 24A to 24F, the delay time dT3) when the gate voltage VCNT of the MOS transistor Q32 is increased. Therefore, all the current IDS1 flowing between the drain and source of the MOS transistor Q31 contributes to increasing the gate voltage VCNT of the MOS transistor Q32. As a result, it is possible to increase the gate voltage VCNT of the MOS transistor Q32 more rapidly than the related art, that is, it is possible to perform switching at high speed. Since, on this occasion, it is configured to increase the gate voltage VCNT more rapidly using the current IDS1 that basically flows between the drain and source of the MOS transistor Q31, it is possible to utilize the current IDS1 effectively and perform switching operation efficiently.

Note that, in FIGS. 24A to 24F, the delay time dT3 after the timing signal Tsw31 has risen until the timing signal Tsw33 rises is set at a time equivalent to a required time from a time point at which the switch SW31 is closed to a time point at which the MOS transistor Q32 turns to the ON state. In other words, it is configured to make the current IDS1 flowing between the drain and source of the MOS transistor Q31 contribute to increase in the gate voltage VCNT by keeping the switch SW33 in the open state while the gate voltage VCNT of the MOS transistor Q32 is required to be increased and close the switch SW33 at a point of time at which the gate voltage VCNT has reached the settled voltage Vs and it becomes not necessary to increase the gate voltage VCNT any further. Therefore, it is possible to supply the current IDS1 flowing between the drain and source of the MOS transistor Q31 to the gate Vcnt only when required.

When the delay time dT3 is shorter than the time equivalent to the required time from a time point at which the switch SW31 is closed to a time point at which the MOS transistor Q32 turns to the ON state, the supply of the current IDS1 to the gate Vcnt of the MOS transistor Q32 is caused to start to be limited before the gate voltage VCNT of the MOS transistor Q32 coincides with the settled voltage Vs. Thus, a timing at which the MOS transistor Q32 turns to the ON state is caused to be delayed. Therefore, it is preferable that the delay time dT3 be approximately the required time from a time point at which the switch SW31 is closed to a time point at which the MOS transistor Q32 turns to the ON state, that is, a required time for the gate voltage VCNT to settle to the settled voltage Vs and for the MOS transistor Q32 to become maintained in the ON state.

The switch SW33 and the current source I1d in the switch circuit SC1d may be replaced with the diode-connected MOS transistor Q13 in the switch circuit SC1a in FIG. 8 or the diode element D1 in the switch circuit SC1b in FIG. 13.

Figure 25:
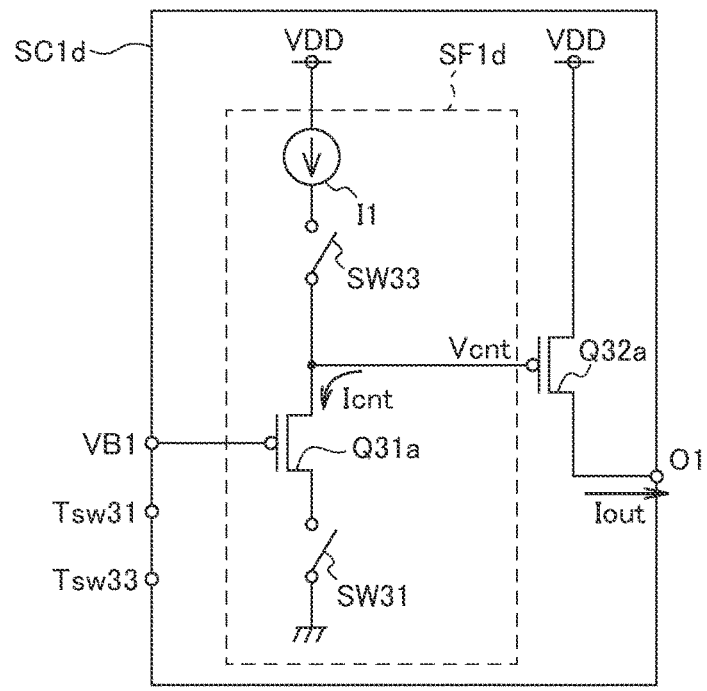
FIG. 25 is a configuration diagram illustrative of a variation of the switch circuit.

Although, in the laser irradiation device 1d in the fifth embodiment, a circuit example that drives the anode-grounded laser diode LD1 was described, a circuit configuration in which the N-type MOS transistors Q31 and Q32 in FIG. 22 are replaced with P-type MOS transistors Q31a and Q32a, respectively, and holes are used as carriers, as illustrated in FIG. 25 may be configured when a cathode-grounded laser diode is driven.

Figure 26:
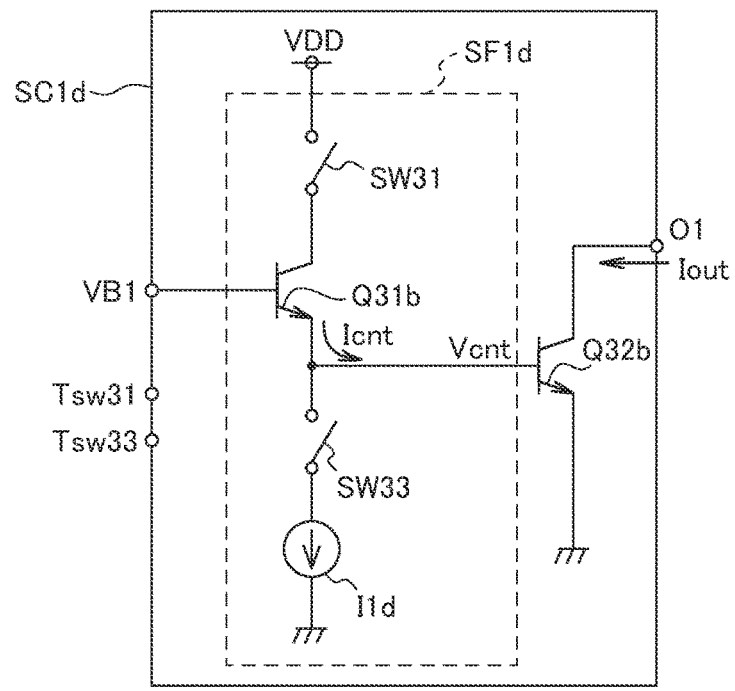
FIG. 26 is a configuration diagram illustrative of another variation of the switch circuit.
Figure 27:
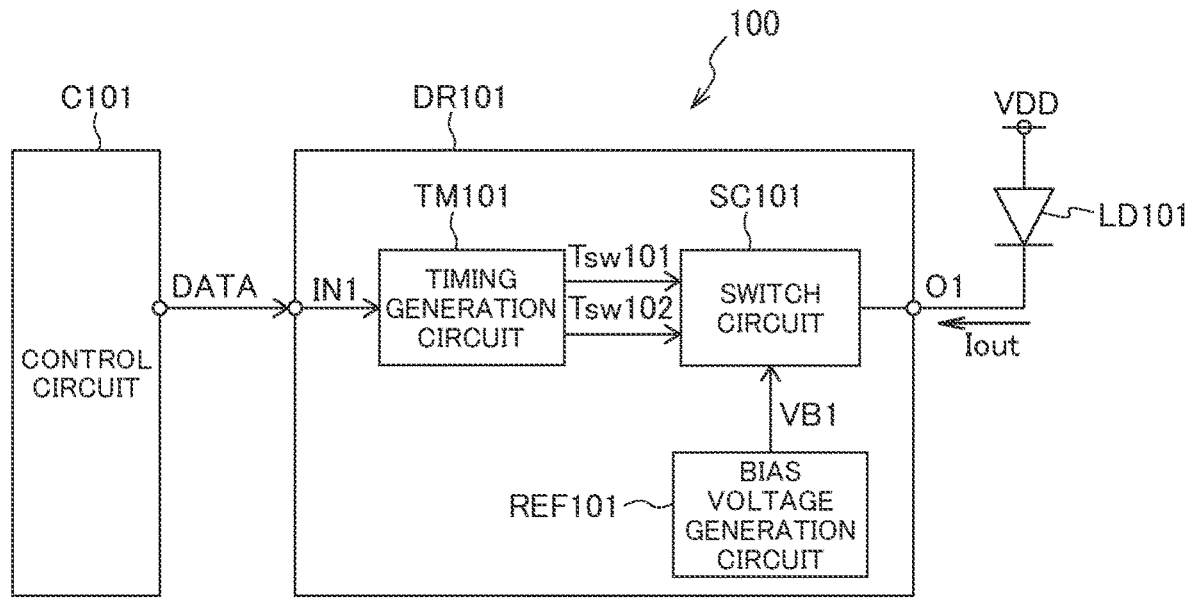
FIG. 27 is a block diagram illustrative of an example of a conventional laser irradiation device.
Figure 28:
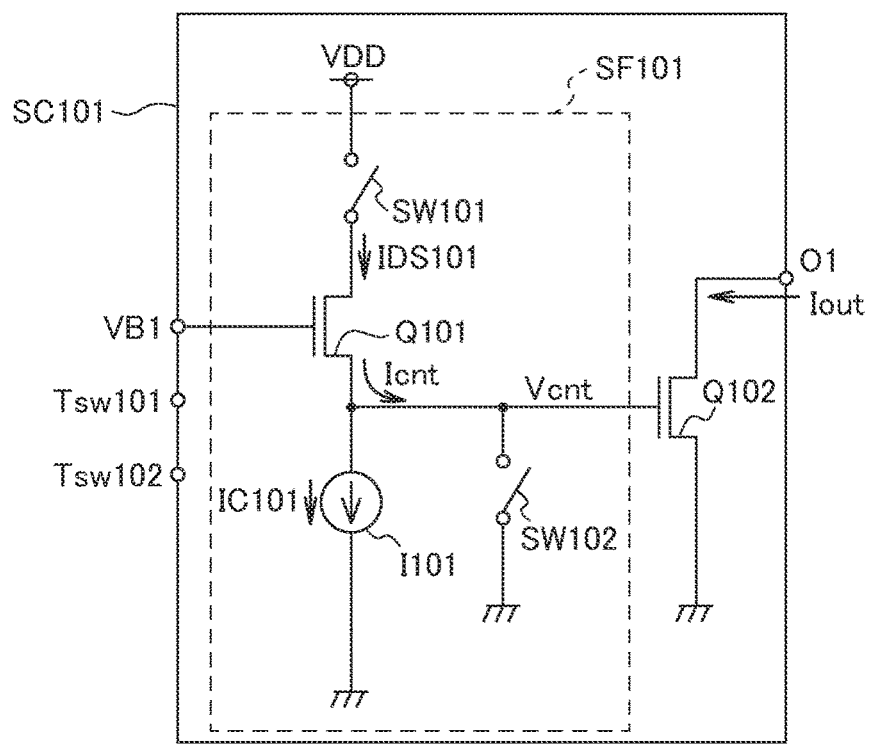
FIG. 28 is a configuration diagram illustrative of an example of a conventional switch circuit.
Figure 29:
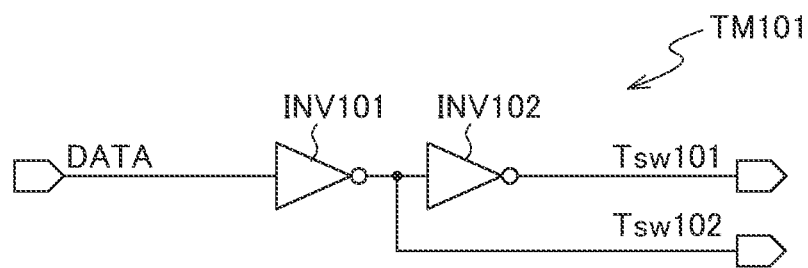
FIG. 29 is a configuration diagram illustrative of an example of a timing generation circuit.

In addition, although, in the laser irradiation device 1d in the fifth embodiment, a case where MOS transistors are used as the MOS transistor Q31 forming a source follower and the MOS transistor Q32 constituting the output stage was described, all the MOS transistors Q31 and Q32 may be replaced with bipolar transistors Q31b and Q32b, as illustrated in FIG. 26 or only either of the MOS transistors Q31 and Q32 may be replaced with a bipolar transistor.

In the laser irradiation device 1d, with regard to the switch SW31 and the MOS transistor Q31, which are connected in series, the switch SW31 may be connected to the power supply line VDD as illustrated in FIG. 22 or the MOS transistor Q31 may be connected to the power supply line VDD. Similarly, with regard to the switch SW33 and the constant current source I1d, which are connected in series, the switch SW33 may be connected to the MOS transistor Q31 as illustrated in FIG. 22 or the constant current source I1d may be connected to the MOS transistor Q31.

While the embodiments of the present invention have been described above, the above-described embodiments indicate devices and methods to embody the technical idea of the present invention by way of example, and the technical idea of the present invention does not limit the materials, shapes, structures, arrangements, and the like of the constituent components to those in the embodiments. The technical idea of the present invention can be subjected to a variety of alterations within the technical scope prescribed by the claims described in CLAIMS.

REFERENCE SIGNS LIST 1, 1a, 1c, 1d Laser irradiation device
C1 Control circuit
DR1, DR1a, DR1c, DR1d Current drive circuit
LD1 Laser diode
TM1, TM1a, TM1c, TM1d Timing generation circuit
SC1, SC1a, SC1b, SC1c, SC1d Switch circuit
REF1 Bias voltage generation circuit
SF1, SF1a, SF1b, SF1c, SFd Current control circuit
Q1, Q2 MOS transistor
Q11, Q12, Q13 MOS transistor
Q21, Q22 MOS transistor
Q31, Q32 MOS transistor
I1, I1c, I1d Constant current source
SW1, SW2, SW3 Switch
SW11, SW12 Switch
SW21, SW22, SW23 Switch
SW31, SW33 Switch
D1 Diode
O1 Output terminal

The invention claimed is:

1. A switch circuit comprising:
a first circuit comprising a first transistor and a first switch, wherein a first end of the first transistor is coupled to a first power supply and to a control terminal of the first transistor is configured for input of a predetermined bias voltage, and wherein the first switch is coupled between the first power supply and the first end of the first transistor or one end of the first switch is coupled to a second end of the first transistor;
a second transistor coupled between an output terminal and a second power supply;
a current adjustment circuit comprising a third switch and a current source connected in series with each other and coupled between the second end of the first transistor of the first circuit and the second power supply, wherein, in a first time period after the first switch turns on until the second transistor turns on, current is prevented from flowing from the first transistor to the second power supply, and in a second time period after the second transistor turns on until the first switch turns off, a current flows from the first transistor to the second power supply after the second transistor turns on until the first switch turns off, and
a control unit configured to control the third switch to turn off during the first time period after the first switch turns on until the second transistor turns on and configured to control the third switch to turn on from an off state at a predetermined time after the first switch was turned on such that both the first switch and the third switch are on during the second time period.

2. The switch circuit according to claim 1 further comprising a second switch coupled between the second power supply and a control terminal of the second transistor and configured to be controlled to turn on and off in a complementary manner to the first switch.

3. The switch circuit according to claim 1, wherein the current adjustment circuit has one end coupled to a common node between the other end of the first transistor and the control terminal of the second transistor and the other end connected to the second power supply.

4. The switch circuit according to claim 1, wherein
the control unit is configured to control the first switch.

5. The switch circuit according to claim 2, wherein
the control unit is configured to control at least either of the first switch and the second switch.

6. The switch circuit according to claim 1, wherein the current adjustment circuit includes a diode, an anode side of which is connected to the other end of the first transistor and a cathode side of which is connected to the second power supply.

7. The switch circuit according to claim 1, wherein the second transistor is a MOS transistor.

8. A laser irradiation device comprising:
a switch circuit according to claim 1; and
a laser diode connected to the output terminal.

9. The switch circuit according to claim 1, wherein
the third switch includes one end that is directly connected to the current source and the other end that is directly connected the first transistor, and
by turning off the third switch, no current flows from the first transistor to the second power supply after the first switch turns on until the second transistor turns on.

10. The switch circuit according to claim 1, wherein the current adjustment circuit includes a single diode, an anode side of the single diode being directly connected to the first transistor and a cathode side of the single diode being directly connected to the second power supply.

11. A switch circuit comprising:
a first transistor a first end of which is coupled to a first power supply and a control terminal of which is configured for input of a predetermined bias voltage;
a first switch coupled between the first power supply and the first end of the first transistor or a second end of which is coupled to the other end of the first transistor;
a second transistor coupled between an output terminal and a second power supply;
a current adjustment circuit comprising a third switch and a current source connected in series with each other and coupled to a connection point between an end of a whole of the first transistor and the first switch connected in series on an opposite side to the first power supply and a control terminal of the second transistor, wherein the current adjustment circuit is configured to control a first current flowing from the first transistor to the second power supply such that, in a first time period after the first switch turns on until the second transistor turns on, is less than a second current flowing from the first transistor to the second power supply in a second time period after the second transistor turns on until the first switch turns off, and
a control unit configured to control the third switch to turn off during the first time period after the first switch turns on until the second transistor turns on and configured to control the third switch to turn on from an off state at a predetermined time after the first switch was turned on such that both the first switch and the third switch are on during the second time period.

12. A switch circuit, comprising:
a first circuit comprising a first transistor and a first switch, wherein one end of which the first transistor is coupled to a first power supply and to a control terminal of which a predetermined bias voltage is input and the first switch is coupled between the first power supply and the one end of the first transistor or one end of which is coupled to the other end of the first transistor;
a second transistor coupled between an output terminal and a second power supply; and
a current adjustment circuit including a diode, an anode side of the diode being directly connected to the other end of the first circuit and a cathode side of diode being directly connected to the second power supply.

* * * * *